US011447388B2

(12) United States Patent
Take et al.

(10) Patent No.: US 11,447,388 B2
(45) Date of Patent: Sep. 20, 2022

(54) MEMS PACKAGE, MEMS MICROPHONE AND METHOD OF MANUFACTURING THE MEMS PACKAGE

(71) Applicant: SAE Magnetics (H.K.) Ltd., Hong Kong (HK)

(72) Inventors: Hiroshi Take, Hong Kong (HK); Makoto Yoshida, Hong Kong (HK); Anthony Reymund Melad Binarao, Hong Kong (HK); Cheng Bu Heng, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 288 days.

(21) Appl. No.: 16/789,449

(22) Filed: Feb. 13, 2020

(65) Prior Publication Data
US 2020/0299126 A1 Sep. 24, 2020

(30) Foreign Application Priority Data
Mar. 22, 2019 (JP) .............................. JP2019-054758

(51) Int. Cl.
*H04R 19/00* (2006.01)
*B81B 7/02* (2006.01)
*B81C 1/00* (2006.01)
*H04R 19/04* (2006.01)

(52) U.S. Cl.
CPC ............ *B81B 7/02* (2013.01); *B81C 1/00158* (2013.01); *B81C 1/00166* (2013.01); *H04R 19/04* (2013.01); *B81B 2201/0257* (2013.01); *H04R 2201/003* (2013.01)

(58) Field of Classification Search
CPC .............. B81B 7/02; B81B 2201/0257; B81B 2201/10; B81B 2203/0353; B81B 2207/012; B81B 2207/056; B81C 1/00158; B81C 1/00166; B81C 1/00309; B81C 2203/019; H04R 19/04; H04R 2201/003; H04R 19/005; H04R 31/00
See application file for complete search history.

(56) References Cited

U.S. PATENT DOCUMENTS 9,565,488 B2    2/2017  Friza et al.
2020/0169818 A1*  5/2020  Rombach ............... H04R 1/086

FOREIGN PATENT DOCUMENTS

| JP | 2007-184341 A | 7/2007 |
| JP | 2012-039272 A | 2/2012 |
| JP | 2015-199069 A | 11/2015 |
| JP | 2017-221887 A | 12/2017 |

* cited by examiner

*Primary Examiner* — Matthew A Eason

(57) ABSTRACT

A MEMS package includes a MEMS chip, a package substrate which the MEMS chip is adhered and a thin-film filter which is adhered to the package substrate or the MEMS chip. The thin-film filter includes a thin-film part having a film surface and a rear film surface arranged a rear side of the film surface, and a plurality of through holes being formed to penetrate the thin-film part from the film surface to the rear film surface. The through holes are formed in an adhesive region of the thin-film part. The adhesive region is adhered to the package substrate or the MEMS chip.

11 Claims, 43 Drawing Sheets

(a)

(b)

(a)

(b)

(a)

(b)

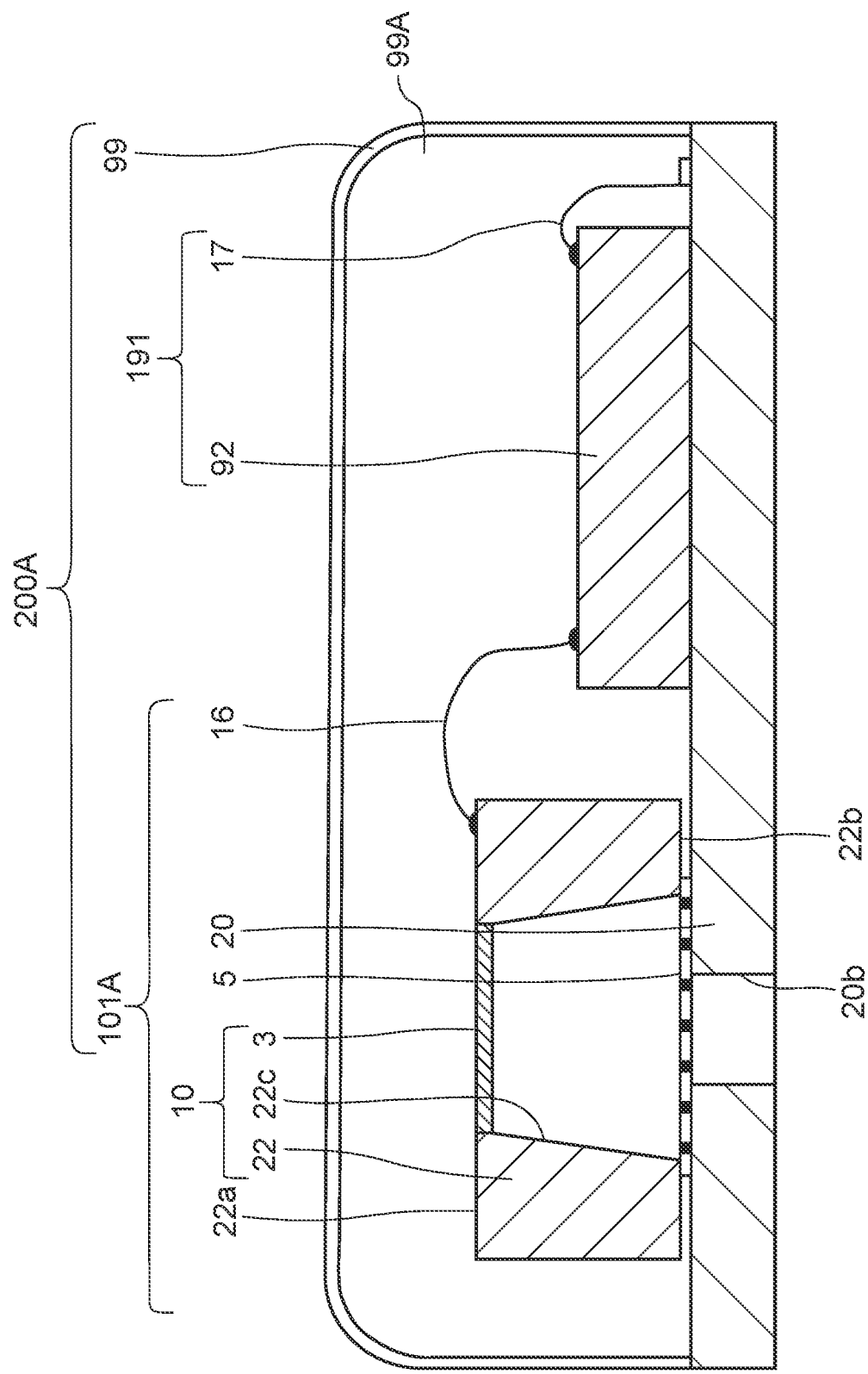

MEMS PACKAGE, MEMS MICROPHONE AND METHOD OF MANUFACTURING THE MEMS PACKAGE

CROSS REFERENCE TO RELATED APPLICATIONS

The present application claims the benefit of Japanese Patent Application No. JP2019-054758 filed on Mar. 22, 2019. All the above are hereby incorporated by reference. the contents of which are incorporated herein by reference in their entirety.

BACKGROUND

Field of the Invention

The present invention relates to a MEMS package which a MEMS chip, being used as a microphone, a sensor and so on, is mounted on a package substrate, a MEMS microphone having the MEMS package and method of manufacturing the MEMS package.

Related Background Art

A minute device, which is called MEMS (Micro Electro Mechanical Systems), is conventionally known. The MEMS is a device which a minute movable element and an electronic circuit are integrated on a substrate (which is also called element substrate) made of silicon and so on. Because the whole of MEMS is formed in a chip-like form, the MEMS is also called a MEMS chip, in the present invention. The MEMS chip is used as a microphone, sensor, actuator and so on.

For example, the MEMS chip, which is used as the microphone, has a membrane being a thin-film and electrodes made of one or two thin-film arranged in the neighborhood of the membrane, and the MEMS chip has a structure which a concave part, for arranging the membrane, is formed. In case of the MEMS chip, which is used as the microphone of capacitance-type, displacement of the membrane, in accordance with sound pressure, is detected as displacement of capacitance between the electrodes. Therefore, the MEMS chip, which is used as the microphone of capacitance-type, operates with the principle of a variable capacitor.

Then, concerning the MEMS package which the MEMS chip is mounted on the package substrate, the following two structures are conventionally known. The one is a structure which the MEMS chip is mounted on the package substrate by a FCB (Flip Chip Bonding, for example see JP2007-184341 (also called patent document 1)), and the other is a structure which the MEMS chip is mounted on the package substrate by a Wire Bonding (for example, see JP2012-39272 (also called patent document 2)).

In case of the MEMS, which is used as the microphone of capacitance-type, there are conventionally two following problems A), B) caused by particles which enter from the outside. A) The particles hit the membrane, thereby the membrane is damaged. B) The particles enter the space between the two electrodes, it lowers the capability of the variable capacitor.

Therefore, a microphone-module, which a thin-film (particle filter) for keeping the particles out is formed on a sound hole, is conventionally known (for example see USP9565488 (also called patent document 3). Further, a microphone-unit, which a provided film keeps dust out in the mounting step or the like, is also known (for example see the patent document 2).

SUMMARY OF THE INVENTION

By the way, a film, which micro perforations are formed, is conventionally known. For example, a polymer film which is disclosed in JP2015-199069 (also called patent document 4), a processed film which is disclosed in JP2017-221887 (also called patent document 5) are known. In case of the conventional polymer film and processed film, it is possible that the films are used for filters for keeping the particles, water out, in the MEMS.

However, because the conventional polymer film and processed film are formed in thin-film like shapes, having a very thin thickness, the films themselves are weak in the strength. Further, the films are needed to be mounted to the MEMS package (the MEMS or package substrate) with adhesion or the like so that these kinds of thin-film like films are used as filters. In that case, because the films are formed in thin-film like shapes, the parts, which are related to the adhesion or the like, are weak in the strength, therefore the films are likely to peel off.

At this point, if the thickness of the films is enlarged, the strength of the films is enhanced, therefore it is preferable that micro perforations are formed in the films, having the enlarged thickness, the micro perforations-formed films are used as the filter.

However, if the thickness of the micro perforations-formed films is enlarged, the vibration of the air is weakened largely by the micro perforations-formed films, in accordance with the enlargement of the thickness. Then, when the MEMS package is used for the microphone, the microphone property such as sensitivity of the microphone, SNR (Signal-to-Noise Ratio) or the like are largely lowered.

Hence the present invention is made to solve the above problem, and it is an object to provide the MEMS package, the MEMS microphone which the adhesion strength of the thin-film like films (thin-film filter), having the micro perforations for prevention of the entering the particles, water, is enhanced, and a method of manufacturing the MEMS package.

To solve the above problem, the present invention is a MEMS package including: a MEMS chip; a package substrate which the MEMS chip is adhered; and a thin-film filter which is adhered to the package substrate or the MEMS chip, the thin-film filter comprises a thin-film part having a film surface and a rear film surface arranged a rear side of the film surface, and a plurality of through holes being formed to penetrate the thin-film part from the film surface to the rear film surface, the through holes are formed in an adhesive region of the thin-film part, the adhesive region is adhered to the package substrate or the MEMS chip.

Further, in case of the above-described MEMS package, it is preferable that the MEMS package further including: an adhesive-layer-entering structure which a filter-adhesive layer, being used for an adhesion of the thin-film filter, enters the through holes.

Further, it is preferable that the filter-adhesive layer is adhered to the adhesive region of the thin-film part and inner wall surfaces of the respective through holes.

Furthermore, it is preferable that the MEMS package further including: stripes-formed inner wall surfaces having stripe-like parts formed along with an intersecting direction intersecting the film surface, the stripes-formed inner wall surfaces are formed inside the respective through holes.

Further, it is possible that the through holes are further formed in a filter region except for the adhesive region of the thin-film part, the MEMS package further comprises stripes-formed inner wall surfaces having stripe-like parts formed along with an intersecting direction intersecting the film surface, the stripes-formed inner wall surfaces are formed respectively inside both the through holes formed in the adhesive region and the through holes formed in the filter region.

Further, it is possible that the stripe-like parts are formed as concave parts which are indented from inner wall surfaces of the through holes or convex parts which protrude from the inner wall surfaces of the through holes, the filter-adhesive layer enters the concave parts when the stripe-like parts are formed as the concave parts, or the filter-adhesive layer is in contact with protruding surfaces, of the convex parts, protrude from the inner wall surfaces when the stripe-like parts are formed as the convex parts.

Further, it is possible that the through holes are formed in circular shapes in a plan view, the thin-film filter includes a first through hole-group and a second through hole-group respectively having the through holes, the first through hole-group has a first through hole, arranged in a position which the interval to a peripheral end part of the thin-film part is set a first interval, and the through holes are arranged at a constant interval in a straight line, the second through hole-group has a second through hole, arranged in a position which the interval to the peripheral end part is set a second interval different from the first interval, and the through holes are arranged at a constant interval in a straight line, in the thin-film filter, a first line formed by the first through hole-group, and a second line formed by the second through hole-group, are arranged alternately.

It is possible that the stripe-like parts are arranged in almost the whole of the inner wall surface of the respective through holes.

It is possible that the stripe-like parts are formed in the length longer than 80% of a film thickness being a thickness of the thin-film part.

Further, the present invention provides a MEMS microphone including: a MEMS package; and a cap which wrap the MEMS package, the MEMS package includes a MEMS chip, a package substrate which the MEMS chip is adhered, and a thin-film filter which is adhered to the package substrate or the MEMS chip, the thin-film filter comprises a thin-film part having a film surface and a rear film surface arranged a rear side of the film surface, and a plurality of through holes being formed to penetrate the thin-film part from the film surface to the rear film surface, the through holes are formed in an adhesive region of the thin-film part, the adhesive region is adhered to the package substrate or the MEMS chip.

Further, the present invention provides a method of manufacturing a MEMS package using a MEMS chip and a package substrate which the MEMS chip is adhered including: a filter-adhesive layer forming step of forming a filter-adhesive layer, made of adhesive, on a surface of a package-panel which a plurality of package-regions, for manufacturing the package substrate, are formed; a thin-film filter peeling-off step of peeling-off a thin-film filter from a peeling-off adhesive layer of a thin-film filter substrate, which is manufactured by performing a peeling-off adhesive layer forming step of forming the peeling-off adhesive layer, capable of being peeled off, on a base substrate and a thin-film filter forming step of forming the thin-film filter on the peeling-off adhesive layer; and a thin-film filter transcribing step for transcribing the thin-film filter, which is peeled off by the thin-film filter peeling-off step, to the package-panel, the thin-film filter forming step comprises a through hole forming step of forming through holes, which penetrate a resin layer being used for forming the thin-film filter, the through holes are formed in an adhesion planned region, of the resin layer, which is planned to be adhered to the package substrate, the thin-film filter transcribing step is performed so that parts of the filter-adhesive layer enters the respective through holes, after the adhesion planned regions are overlaid on the filter-adhesive layer.

Further, it is possible that the thin-film filter forming step is performed so that a filter layer, which a plurality of separative regions for forming the thin-film filters are formed with an arrangement in accordance with the respective package region, is formed on the peeling-off adhesive layer.

Further, the present invention provides a method of manufacturing a MEMS package using a MEMS chip and a package substrate which the MEMS chip is adhered including: an adhesive-layer-formed filter substrate manufacturing step for forming an adhesive-layer-formed filter substrate from forming a filter-adhesive layer made of an adhesive on a surface of a thin-film filter substrate, which is manufactured by performing a peeling-off adhesive layer forming step of forming the peeling-off adhesive layer, capable of being peeled off, on a base substrate and a thin-film filter forming step of forming the thin-film filter on the peeling-off adhesive layer; a substrate piling-up step for manufacturing a piled-up substrate piled up a MEMS substrate, which a plurality of MEMS regions for forming the MEMS chips are formed, and the adhesive-layer-formed filter substrate; and a thin-film filter transcribing step for transcribing the thin-film filter by peeling-off the peeling-off adhesive layer and the base substrate from the piled-up substrate with heating the piled-up substrate; the thin-film filter forming step comprises a through hole forming step of forming through holes which penetrate a resin layer being used for forming the thin-film filter, to an adhesion planned region, of the resin layer, being planned to be adhered to the MEMS chip, the method of manufacturing a MEMS package further comprises an entering step, the entering step is performed so that a part of the filter-adhesive layer enters the through holes after the filter-adhesive layer is formed on the adhesion planned region.

In case of the above-described method of manufacturing the MEMS package, it is possible that the thin-film filter forming step is performed so that a filter layer, which a plurality of separative regions, for forming the thin-film filters, are formed with an arrangement in accordance with the respective MEMS regions, is formed on the peeling-off adhesive layer.

Further, it is possible that the through hole forming step is performed so that the through holes are further formed in a filter planned region except for the adhesion planned region of the thin-film filter.

Further, in case of the above-described method of manufacturing the MEMS package, the through hole forming step is performed so that stripes-formed inner wall surfaces, having stripe-like parts formed along with an intersecting direction intersecting the surface of the resin layer, are formed inside the respective through holes.

Further, it is possible that the thin-film filter forming step further includes a metal layer forming step of forming a metal layer on the surface of the resin layer, a resist pattern forming step of forming a resist pattern, which a plurality of hole parts are formed, on the metal layer, and a metal pattern forming step of forming a metal pattern by forming corresponding hole parts, to the metal layer, corresponding to the hole parts using the resist pattern as a mask, the through hole forming step is performed by performing reactive ion etching using the metal pattern as a mask to form the stripes-formed inner wall surfaces.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 43 is a sectional view, corresponding to FIG. 1, of the MEMS microphone, having the MEMS package according to the second modified example.

DETAILED DESCRIPTION OF THE EMBODIMENTS

In the following, embodiments of the present invention will be described with reference to the drawings.

Note that the same components will be referred to with the same numerals or letters, while omitting their overlapping descriptions.

First Embodiment (Structure of the MEMS Package, the MEMS Microphone)

Figure 1:
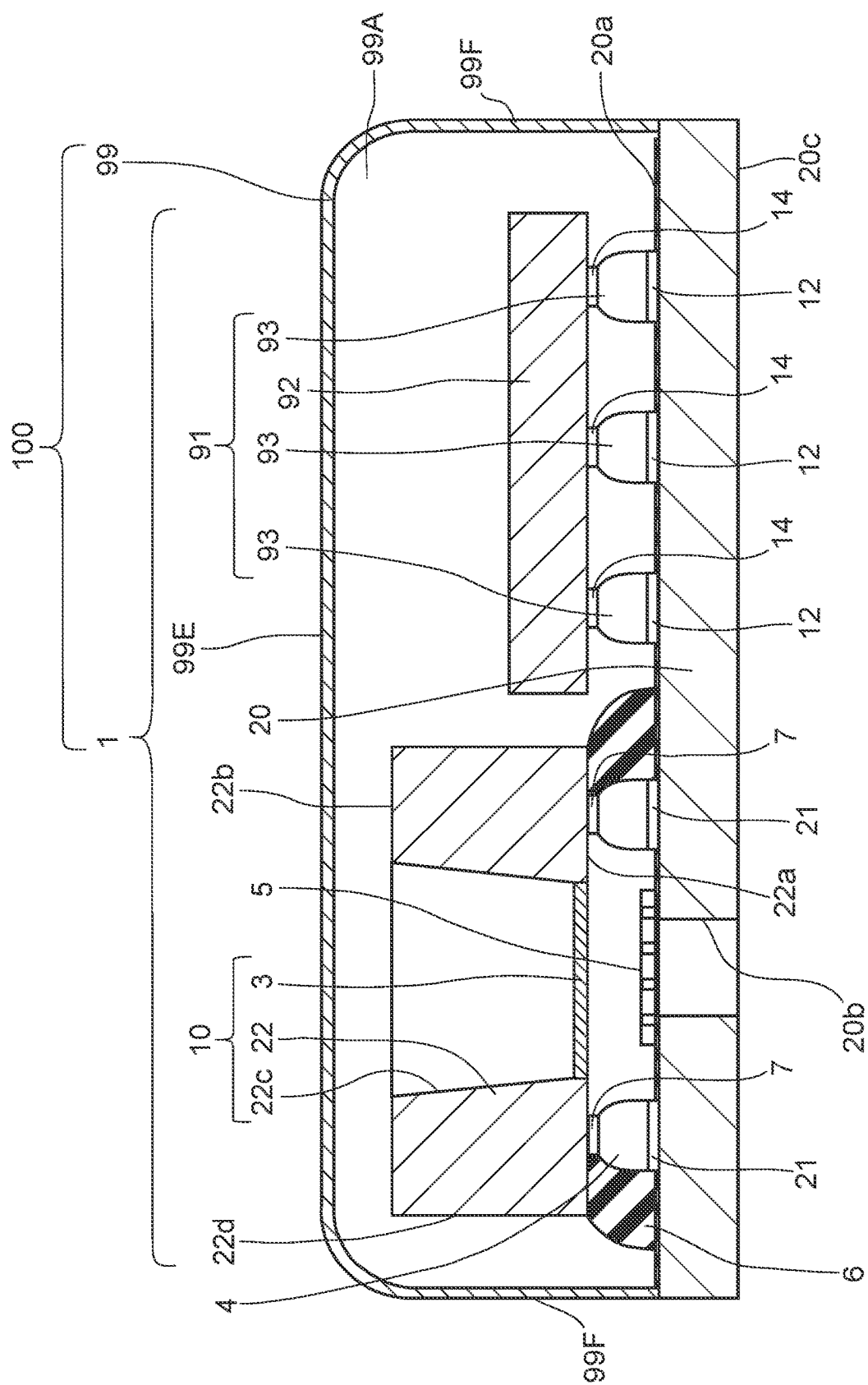
FIG. 1 is a sectional view showing a part, corresponding to the line 1-1 in FIG. 3, of a MEMS microphone according to the embodiment of the present invention.
Figure 2:
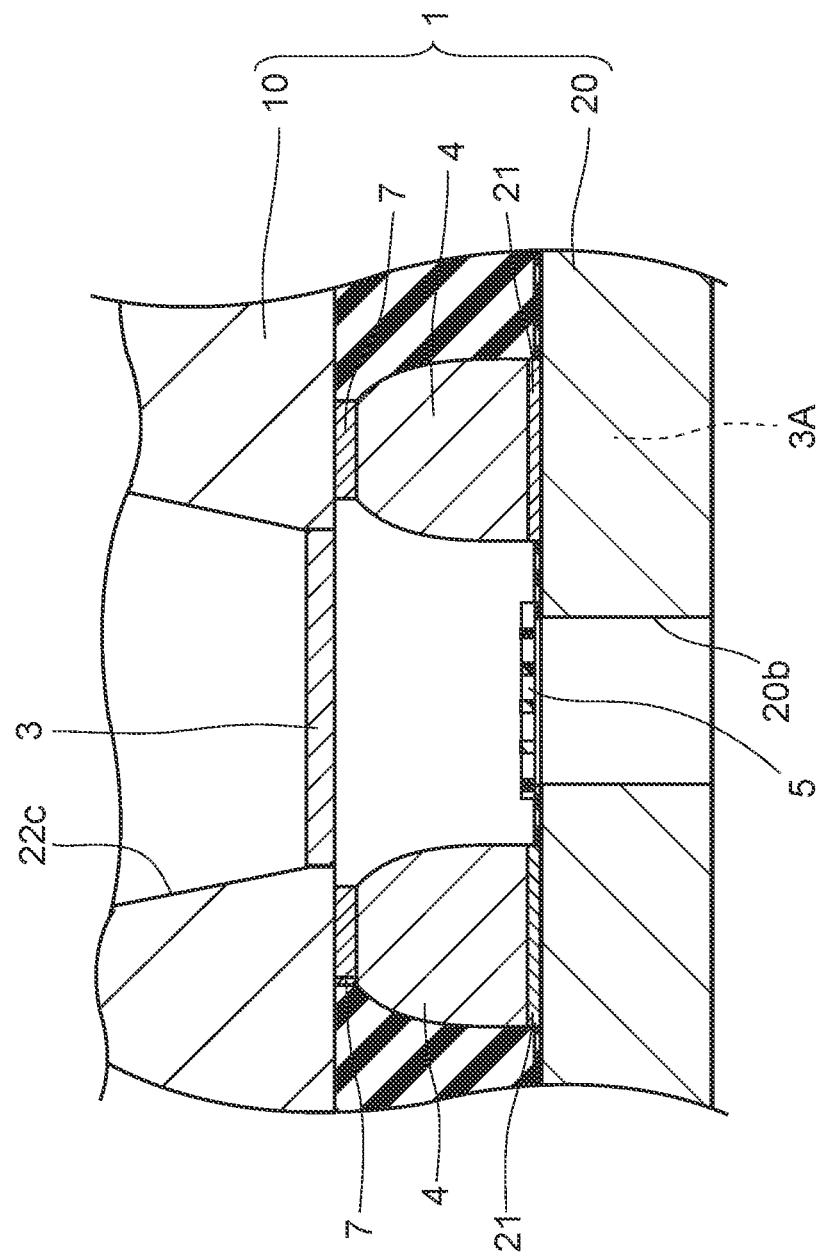
FIG. 2 is a sectional view, with enlargement, showing a principal part of FIG. 1.
Figure 3:
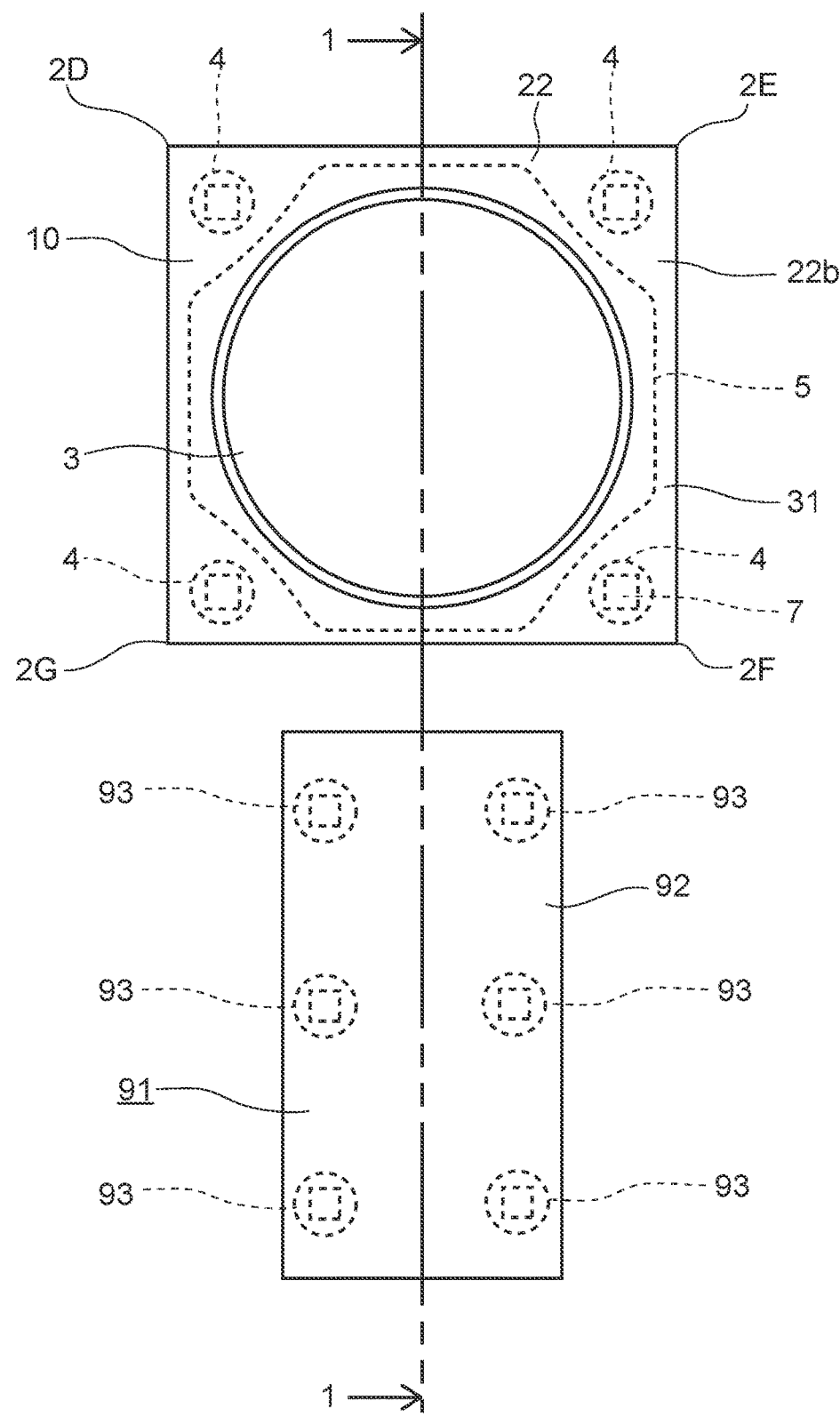
FIG. 3 is a plan view showing a principal part of the MEMS microphone which a cap is removed.

To begin with, the structures of the MEMS package 1 and the MEMS microphone 100, according to the first embodiment of the present invention, will be explained with reference to FIG. 1 to FIG. 3. Here, FIG. 1 is a sectional view showing a part, corresponding to the line 1-1 in FIG. 3, of a MEMS microphone 100 according to the first embodiment of the present invention. FIG. 2 is a sectional view, with enlargement, showing a principal part of FIG. 1. FIG. 3 is a plan view showing a principal part of the MEMS microphone 100 which a cap 99 is removed.

As illustrated in FIG. 1, the MEMS microphone 100 has the MEMS package 1 and the cap 99.

The MEMS package 1 has the MEMS chip 10, the package substrate 20, which the MEMS chip 10 is adhered, bonding bumps 4, the thin-film filter 5 and a sound shield 6. Further, the MEMS package 1 has an ASIC (Application Specific Integrated Circuit) package 91. In case of the MEMS package 1, the MEMS chip 10 and the ASIC 92 are mounted on the package substrate 20 by a FCB (Flip Chip Bonding).

The MEMS chip 10 has an element substrate 22 which the membrane 3, as a movable element, is formed. The MEMS chip 10 is used as the microphone of capacitance-type. The element substrate 22 is a substrate (substrate having the side surface 22d) formed in a rectangular-shape in a plan view, as illustrated in FIG. 3, and it is formed with silicon. A hole part 22c is formed in the center of the element substrate 22. The hole part 22c is formed in a cylindrical-shape from a substrate surface 22b (outside surface of the element substrate 22) of the element substrate 22 to an opposing surface 22a (the surface opposing to the package substrate 20), and the membrane 3 is formed in the opposing surface 22a side of the hole part 22c. Note that two thin-films, which are called back-plates (not illustrated), are arranged in the upper side and the lower side of the membrane 3.

The membrane is vibration film formed approximately in a circular-shape, and it is a thin-film made of an inorganic metal such as $SiO_2$, SiN or the like.

The bonding bumps 4 are solder bumps made of solder. As illustrated in FIG. 2, the bonding bumps 4 are respectively arranged in a neighborhood of corner parts 2D, 2E, 2F, 2G.

As illustrated in FIG. 1, the bonding bumps 4 are adhered to both the MEMS chip 10 and the package substrate 20. Namely, the bonding bumps 4 are adhered to electrode pads 7, formed in the opposing surface 22a, and electrode pads 21 formed in a package surface 20a (surface of the package substrate 20 in the MEMS chip 10 side) of the package substrate 20. The bonding bumps 4 connect the MEMS chip 10 electrically and fixedly to the package substrate 20.

In the MEMS microphone 100, a later-described thin-film filter 5 is adhered to the package substrate 20 so as to cover a later-described sound hole 20b. The thin-film filter 5 is formed with a later-described thin-film filter substrate 19. As illustrated in FIG. 3, the thin-film filter 5 is formed in a modified rectangular shape which four corner parts are removed.

The sound shield 6 is made of silicone resin or the like, and it is formed between the MEMS chip 10 and the package substrate 20 so as to surround the MEMS chip 10.

The package substrate 20 is a board like member made of such as silicon, ceramic or the like (or PCB: Printed Circuit Board). The electrode pads 21 and electrode pads 12 are formed on the package surface 20a of the package substrate 20. The MEMS chip 10 is mounted on the part, of the package surface 20a, which the electrode pads 21 are formed, the ASIC package 91 is mounted on the part which the electrode pads 12 are formed. Further, the sound hole 20b is formed on the part, of the package substrate 20, which the MEMS chip 10 is mounted. The sound hole 20b penetrates the package substrate 20 from the package surface 20a to a bottom surface 20c on the opposite side.

The ASIC package 91 has an ASIC 92, and the bonding bumps 93. The ASIC 92, for example, is an integral circuit which amplifies an output signal of the MEMS chip 10 (an integral circuit which outputs displacement of a capacitance as displacement of the voltage in the MEMS chip 10). Electrode pads 14 are formed lower side of the ASIC 92. The electrode pads 14 are connected to the electrode pads 12 of the package surface 20a by the bonding bumps 93. The ASIC 92 is mounted on the package substrate 20.

The cap 99 covers the MEMS package 1, and it is adhered to the package surface 20a with not illustrated adhesive (or by soldering). A space 99A is secured by the cap 99 and the package substrate 20, the MEMS package 1 is accommodated in the space 99A.

(Thin-Film Filter)

Figure 4:
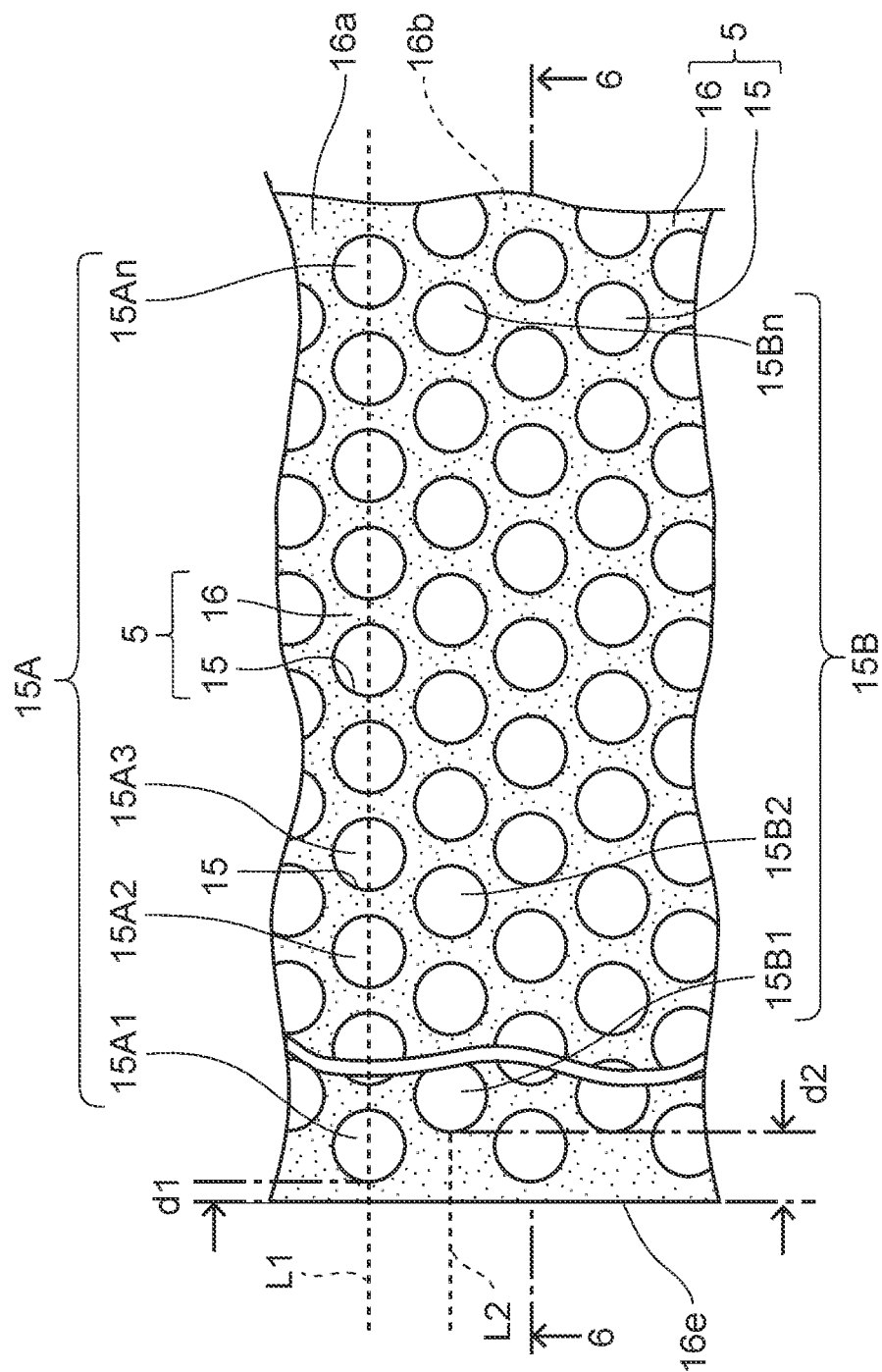
FIG. 4 is a plan view, with enlargement, showing the principal part of a thin-film filter which is included in the MEMS microphone illustrated in FIG. 1.
Figure 5:
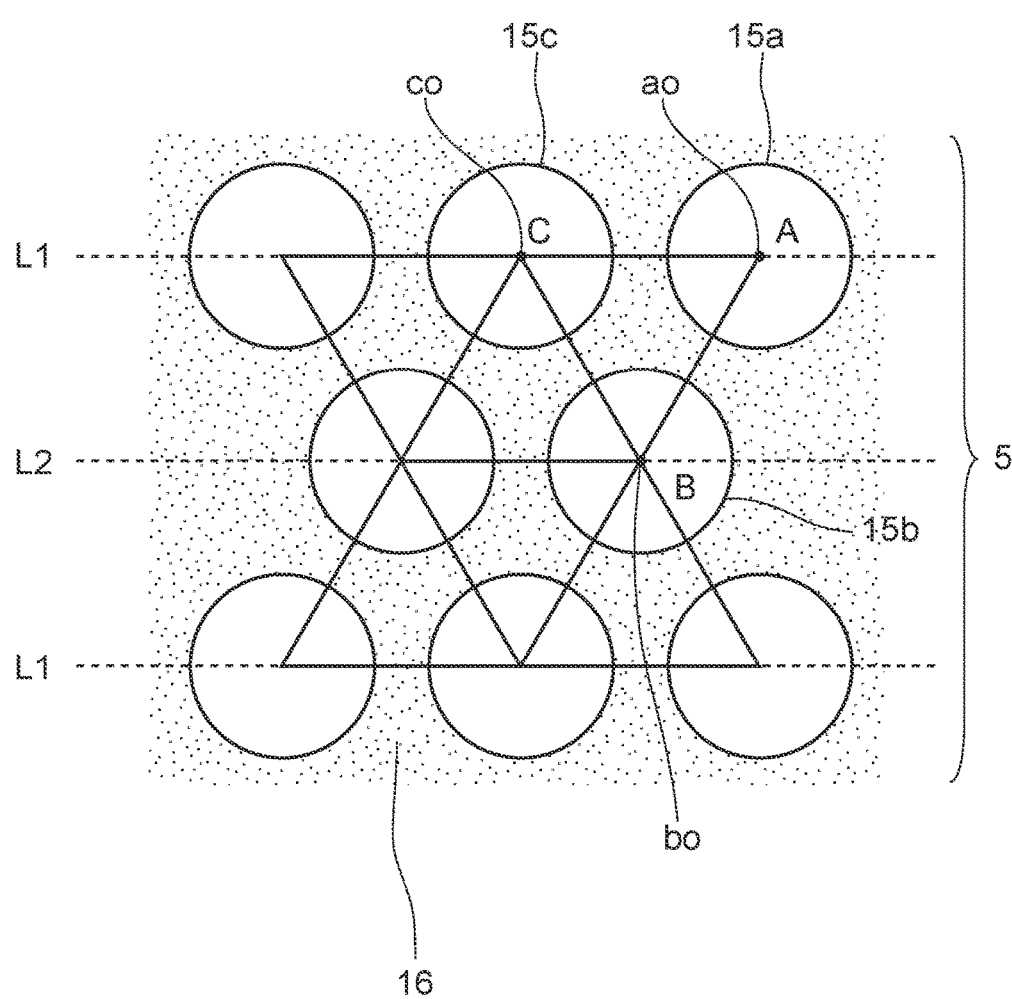
FIG. 5 is a plan view of the part, including a plurality of through holes, of the thin-film filter.
Figure 6:
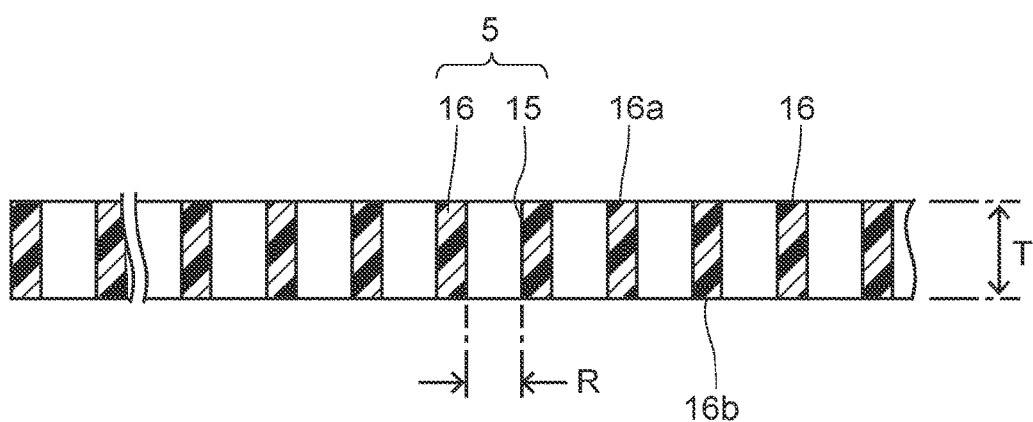
FIG. 6 is a sectional view showing a part corresponding to the line 6-6 in FIG. 4.
Figure 7:
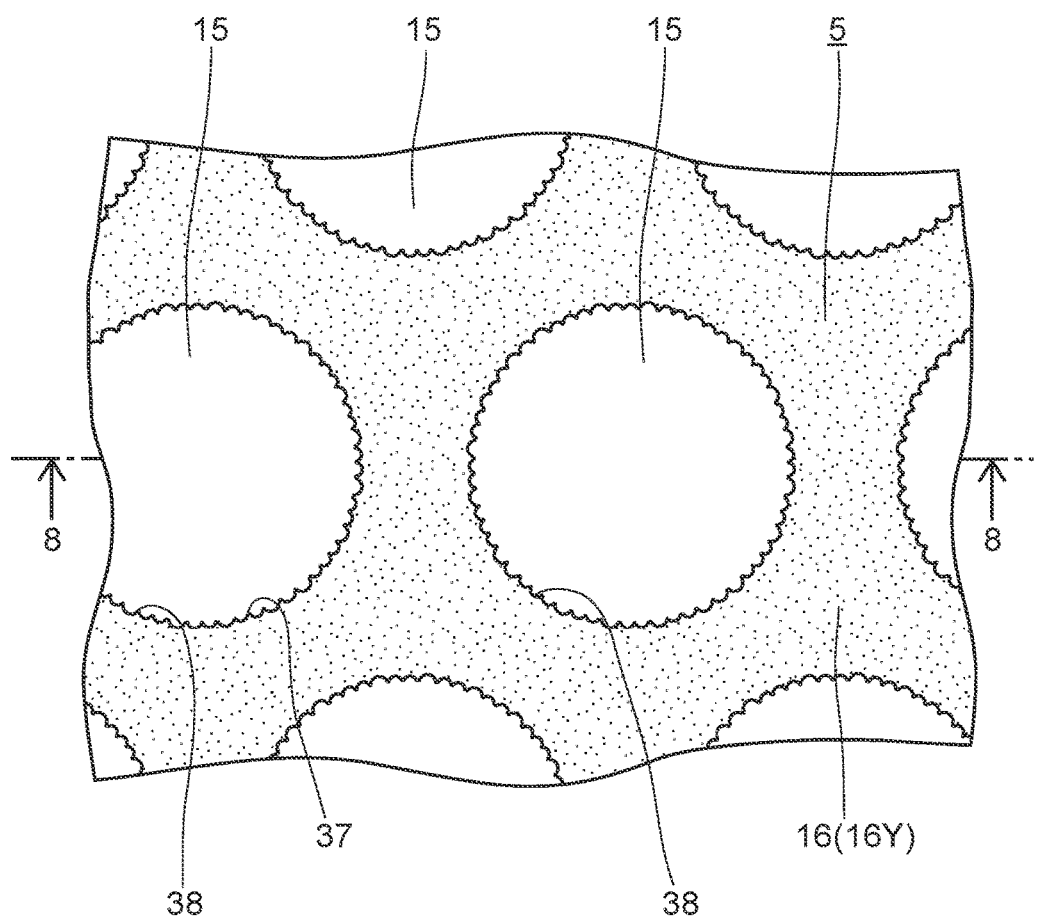
FIG. 7 is a plan view, with more enlargement, of the principal part of the thin-film filter.
Figure 8:
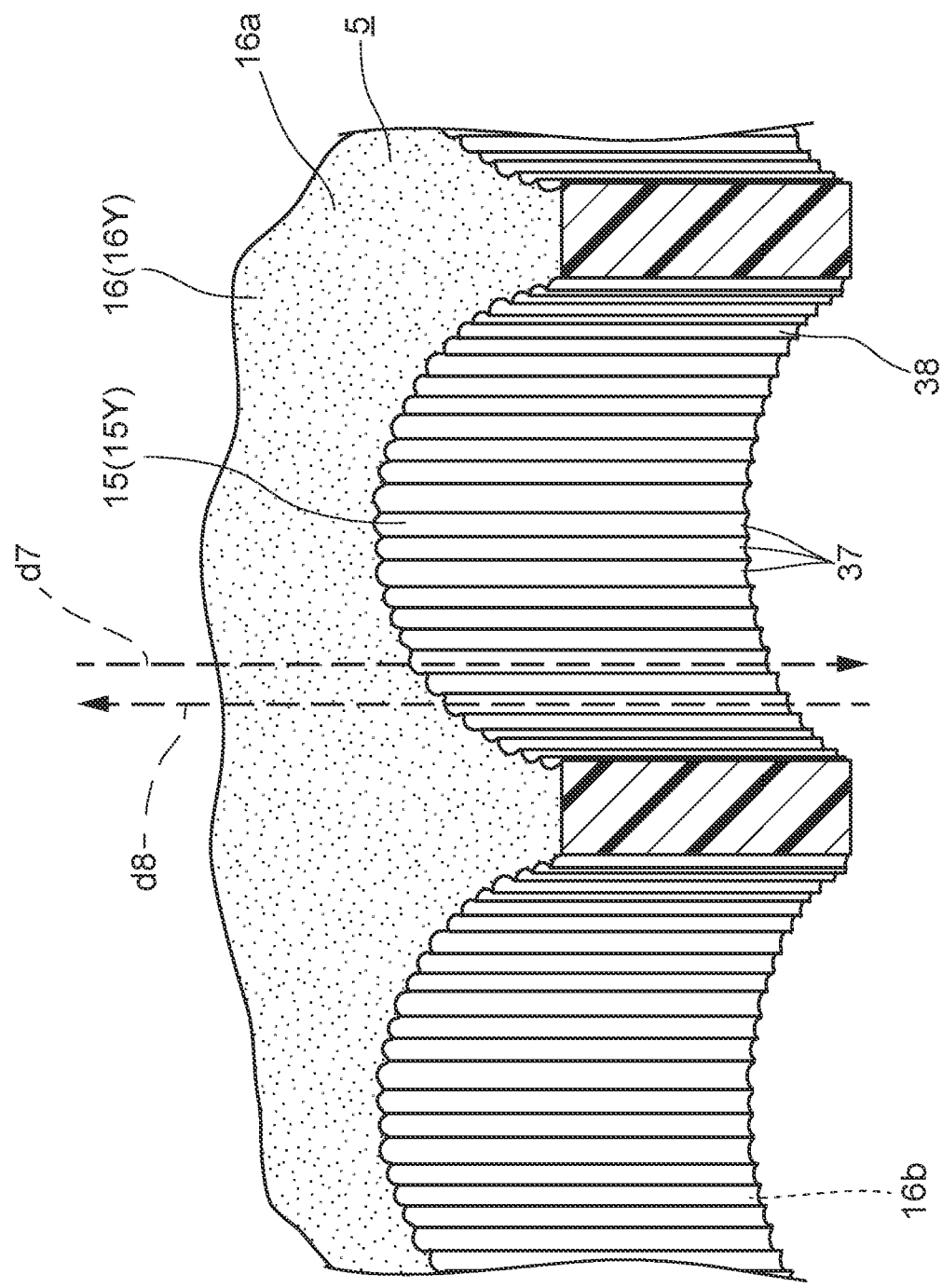
FIG. 8 is a perspective view showing a sectional surface corresponding to the line 8-8 in FIG. 7.

Subsequently, the thin-film filter 5 will be explained with reference to FIG. 4 to FIG. 8, FIG. 15(a). Here, FIG. 4 is a plan view, with enlargement, showing the principal part of the thin-film filter 5. FIG. 5 is a plan view of the part, including a plurality of through holes 15, of the thin-film filter 5. FIG. 6 is a sectional view showing a part corresponding to the line 6-6 in FIG. 4. FIG. 7 is a plan view, with more enlargement, of the principal part of the thin-film filter 5. FIG. 8 is a perspective view showing a sectional surface corresponding to the line 8-8 in FIG. 7. FIG. 15(a) is a perspective view showing a principal part of a stripe-like part 37.

The thin-film filter 5 is a filter used for prevention of entry of particles and water. As illustrated in FIG. 4, the thin-film filter 5 has a thin-film part 16, which is formed with polyamide or polyimide film. Further, a plurality of through holes 15 are formed in the thin-film part 16, and stripes-formed inner wall surfaces 38, as illustrated in FIGS. 7, 8, are formed inside the respective through holes 15.

The thin-film part 16 has a film surface 16a, being a surface of one side, and a rear film surface 16b, being arranged rear side of the film surface 16a, as illustrated in FIG. 6. A plurality of through holes 15 are formed in the thin-film part 16 by a regular uniformly arrangement. In FIG. 4, FIG. 5, FIG. 7, dots are shown in the film surface 16a.

The respective through holes 15 are hole parts which penetrate from the film surface 16a to the rear film surface 16b, as illustrated in FIG. 6. The respective through holes 15 are formed in the constant size (diameter), from the film surface 16a to the rear film surface 16b. The through holes 15 are also formed so that the intervals of the adjacent through holes 15 are constant sizes.

Further, the respective through holes 15 are formed in a circular shape in a plan view. The diameters (shown as "R" in FIG. 6) is approximately about 2 μm to 6 μm. Further, the thickness (shown as "T" in FIG. 6, corresponding to a film thickness being a thickness of the thin-film part 16) of the thin-film filter 5 is approximately about 1 μm to 6 μm.

Then, as illustrated in FIG. 4 in detail, the thin-film filter 5 has a first through hole-group 15A and a second through hole-group 15B. A plurality of through holes 15, including a first through hole 15A1, through holes 15A2, 15A3 . . . through hole 15An, are included in the first through hole-group 15A. The first through hole 15A1 is arranged in a position which the interval to a peripheral end part 16e of the thin-film part 16 is set a first interval d1, and it is arranged the nearest position to the peripheral end part 16e among the through holes 15 included in the first through hole-group 15A. The first through hole 15A1, through holes 15A2, 15A3 . . . 15An are arranged at a constant interval in a straight line along with a direction intersecting vertically to the peripheral end part 16e to form a first line L1.

A plurality of through holes 15, including a second through hole 15B1, the through hole 15B2, the through hole 15Bn, are included in the second through hole-group 15B. The second through hole 15B1 is arranged in a position which the interval to the peripheral end part 16e is set a second interval d2 larger than the first interval d1, and it is arranged the nearest position to the peripheral end part 16e among through holes 15 included in the second through hole-group 15B. The second through hole 15B1, through holes 15B2 . . . 15Bn are arranged at a constant interval in the direction intersecting vertically to the peripheral end part 16e to form a second line L2.

Further, in the thin-film filter 5, the first line L1 and the second line L2 are arranged alternately.

Furthermore, the thin-film filter 5 is formed so that the center of the through hole 15 (for example, the through hole 15B2, in FIG. 4), included in the second through hole-group 15B, is arranged between the centers of the adjacent through holes 15 (for example, the through hole 15A2, the through hole 15A3, in FIG. 4), included in the first through hole-group 15A.

The through holes 15 become a path of the air though, because the part between the adjacent through holes 15 is the thin-film part 16 (the part with dots in FIG. 4, FIG. 5, FIG. 7), the part does not become the path of the air.

In case of the thin-film filter 5, as illustrated in FIG. 5, the three adjacent through holes 15a, 15b, 15c are considered as the representative through holes. The centers of the through holes 15a, 15b, 15c are a0, b0, c0 though, the triangle (the triangle ABC, in FIG. 5) which these centers are vertexes, is a regular triangle, according to the regularity of the arrangement of the through holes 15. Further, the thin-film filter 5 is formed so that the arrangement density of the through holes 15, in the thin-film part 16, may rise as much as possible. In case of the thin-film filter 5, the intervals between adjacent through holes 15 are narrowed so that another through hole 15 is not able to be formed in the space between the adjacent three through holes 15 (for example, another through hole 15 is not able to be formed in the space between the through holes 15a, 15b, 15c, the structure is also referred to a high-density structure).

Then, in the thin-film filter 5, as illustrated in FIG. 7, FIG. 8, the stripes-formed inner wall surfaces 38 are formed inside the respective through holes 15. The stripes-formed inner wall surfaces 38 have a plurality of stripe-like parts 37. A plurality of stripe-like parts 37 are arranged in almost the whole of the inner wall surface of the respective through holes 15. The stripes-formed inner wall surfaces 38 are formed in almost the whole of the inner wall surface of the respective through holes 15. The stripe-like parts 37 are formed closely so that a smooth part does not remain in the inner wall surface of the respective through holes 15.

The stripe-like parts 37 are formed along with an intersecting direction, which intersects the film surface 16a, namely, a direction which unites the film surface 16a and the rear film surface 16b in the shortest distance (direction shown as "d7", "d8" in FIG. 8).

The respective stripe-like parts 37 are convex parts or concave parts, formed on the inner wall surface of the through holes 15, approximately in the straight line along with the intersecting direction. All of the respective stripe-like parts 37 are able to be formed as the convex parts, and they are able to be formed as the concave parts. The convex parts and the concave parts are able to be included by mixture as the respective stripe-like parts 37.

The stripe-like parts 37 are drawn in FIG. 15(a), as the concave parts along with the intersecting direction. The stripe-like parts 37, drawn in FIG. 15(a), have first stripe-like parts 37a and second stripe-like parts 37b, having wider width than the first stripe-like parts 37a. The respective stripe-like parts 37 are formed in the length longer than 80% of the film thickness T. The length 37L of the respective stripe-like parts 37 have the size larger than the 80% of the film thickness T. It is possible that the length of the respective stripe-like parts 37 are common, like the stripe-like parts 37, shown in FIG. 15(a). It is possible that the length of the respective stripe-like parts 37 are different (not shown in the drawings).

(Adhesive Structure of the Thin-Film Filter 5)

Figure 9:
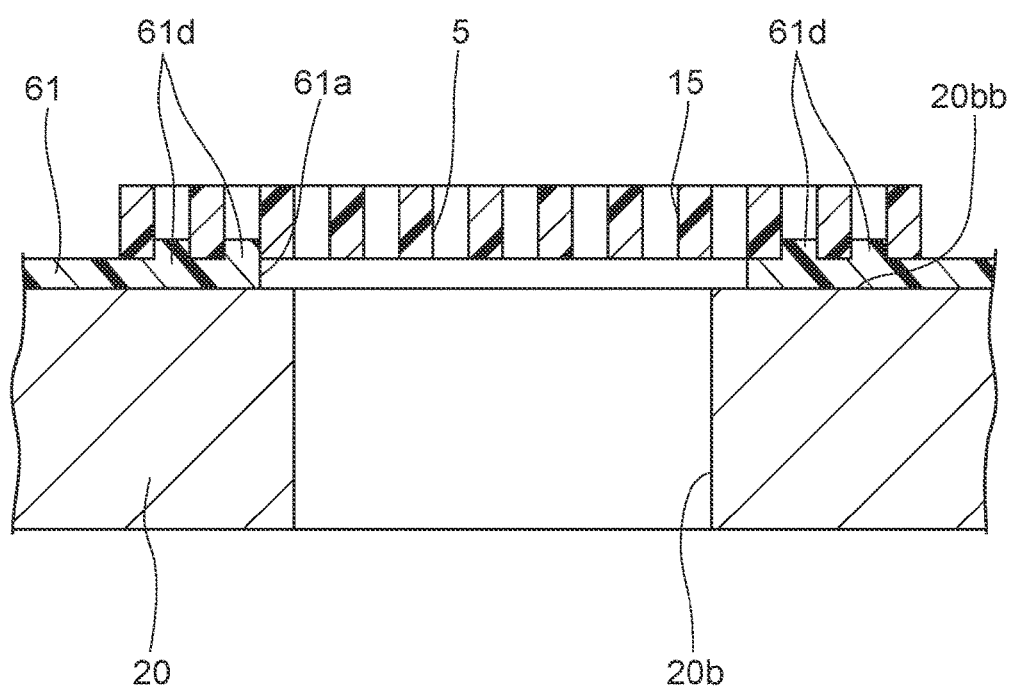
FIG. 9 is a sectional view, with enlargement, showing the principal part of the thin-film filter and an adhesive structure.
Figure 10:
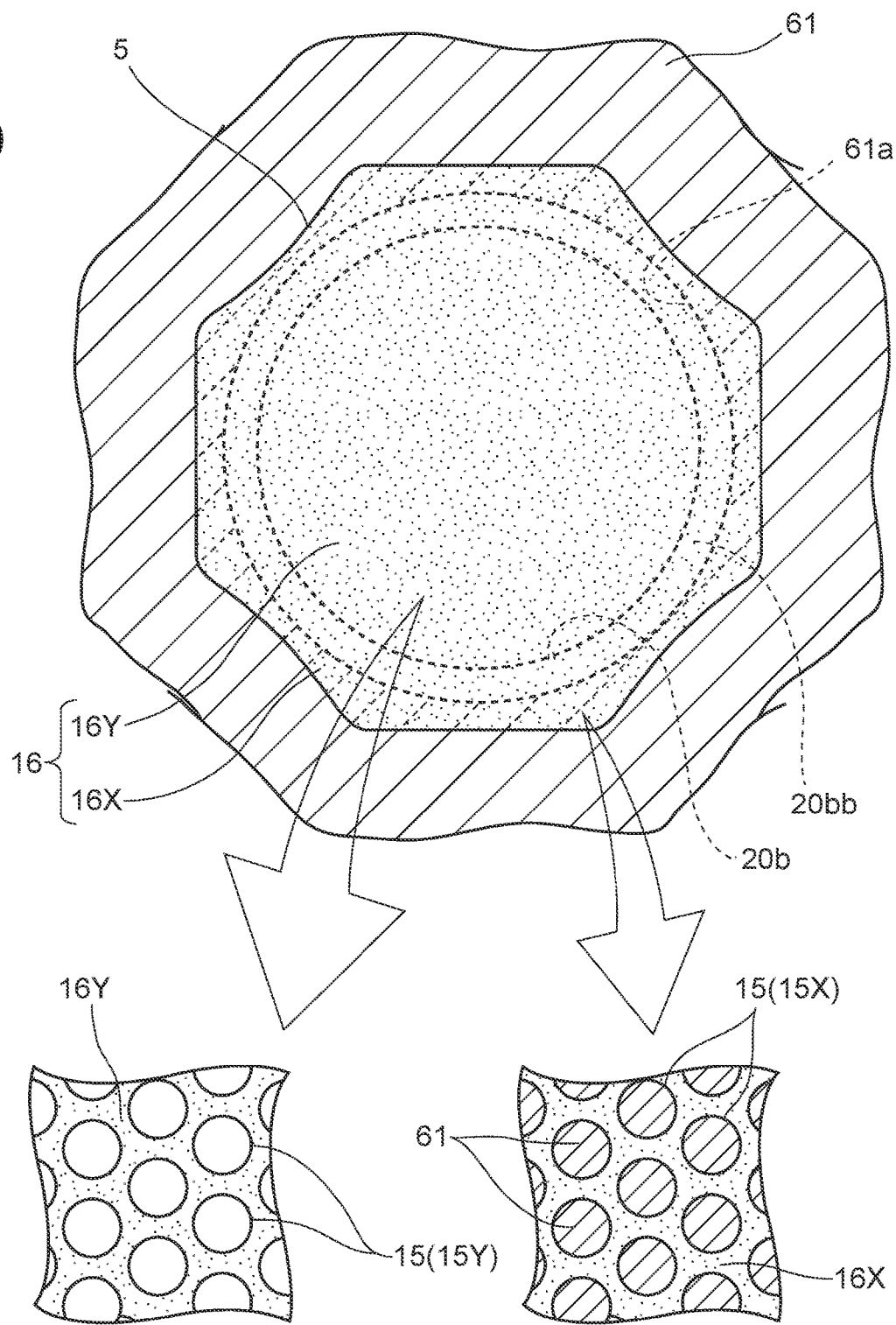
FIG. 10 is a plan view showing the principal part of the thin-film filter and the adhesive structure.
Figure 11:
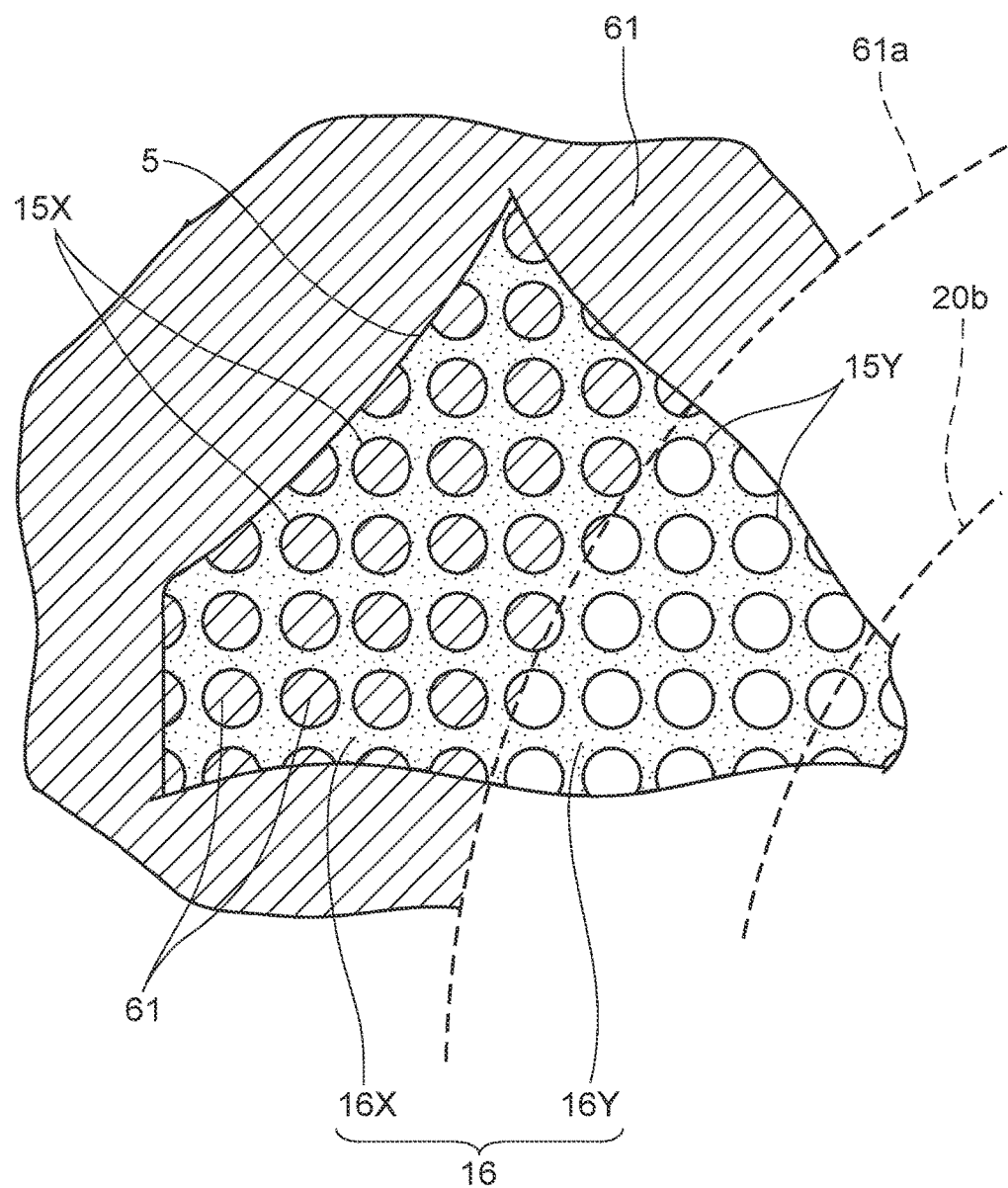
FIG. 11 is a plan view, partially omitted with enlargement, showing the principal part in FIG. 10.
Figure 12:
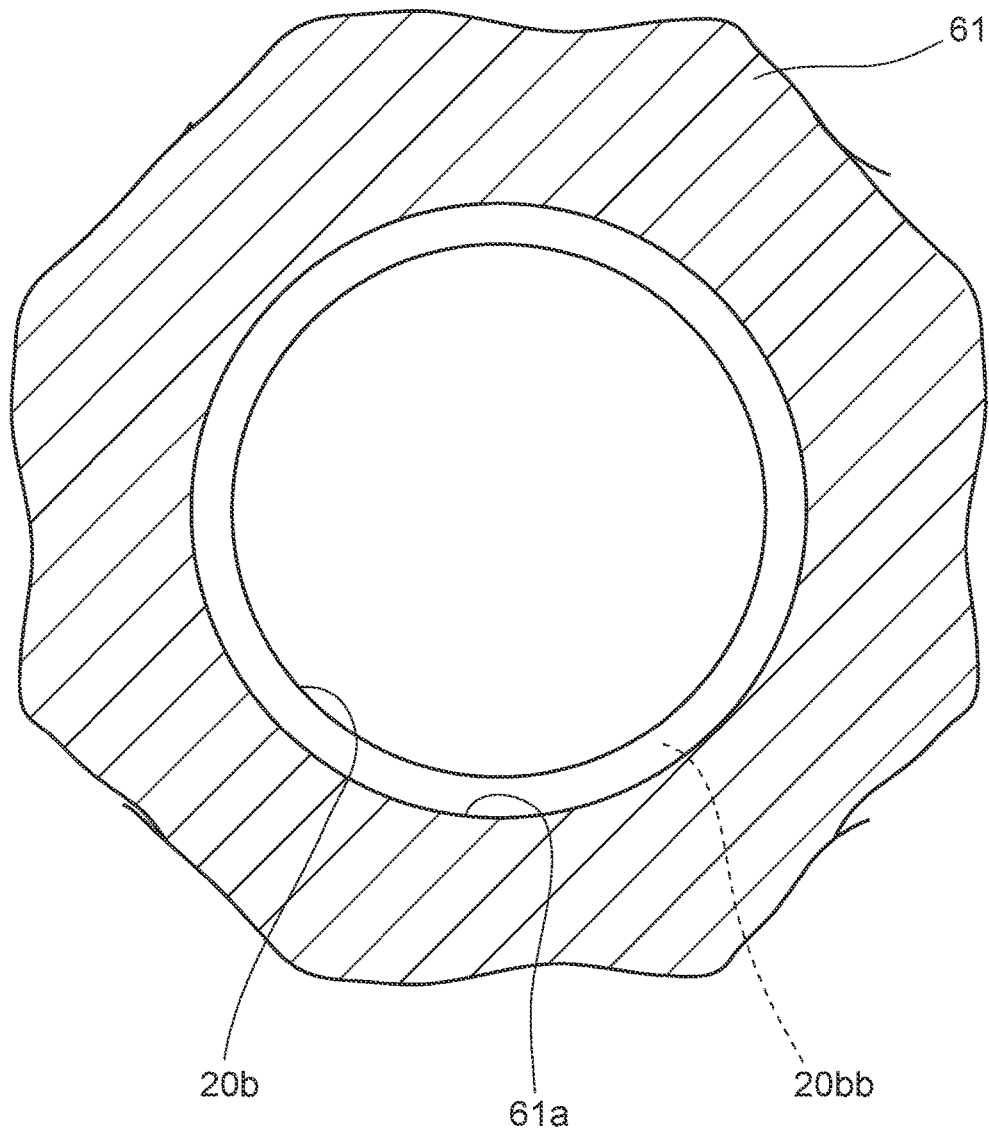
FIG. 12 is a plan view, with enlargement, showing the peripheral part, of a sound hole, which the thin-film filter is adhered.
Figure 13:
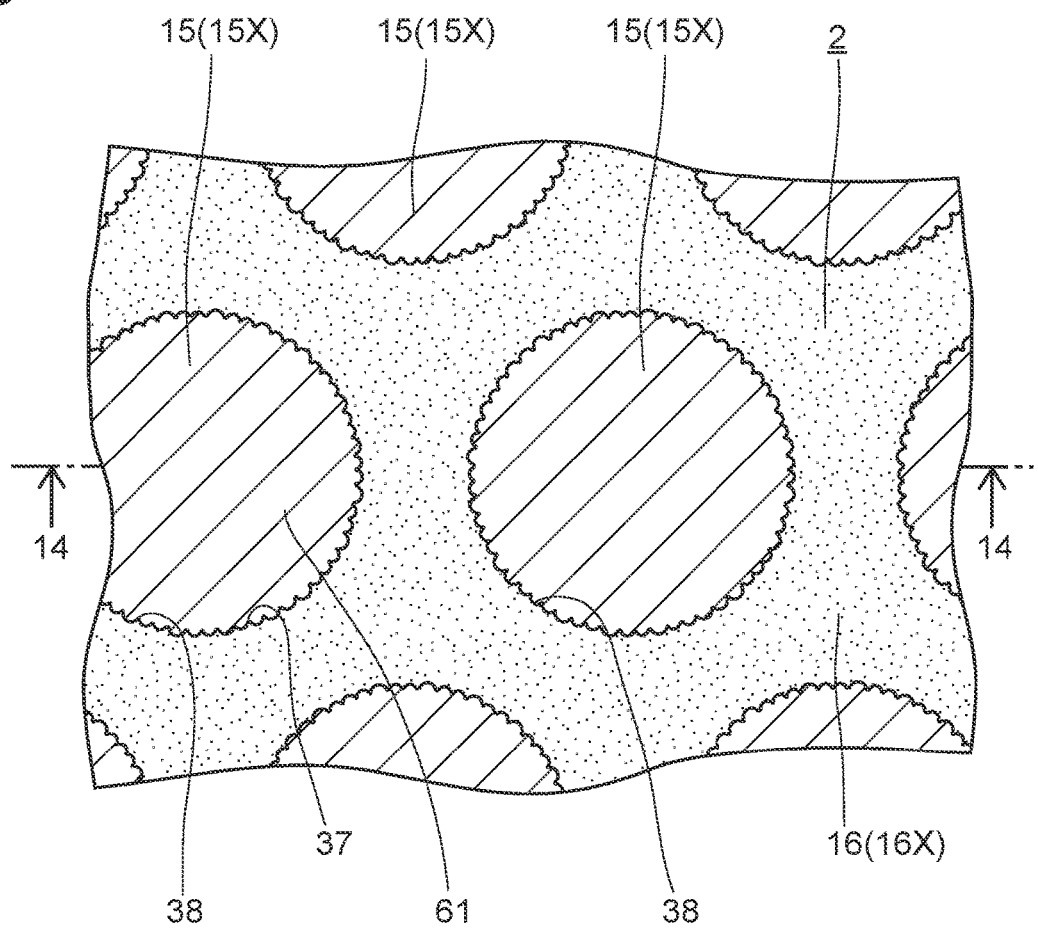
FIG. 13 is a plan view, with more enlargement, showing the principal part, of the thin-film filter, arranged in an adhesive region.
Figure 14:
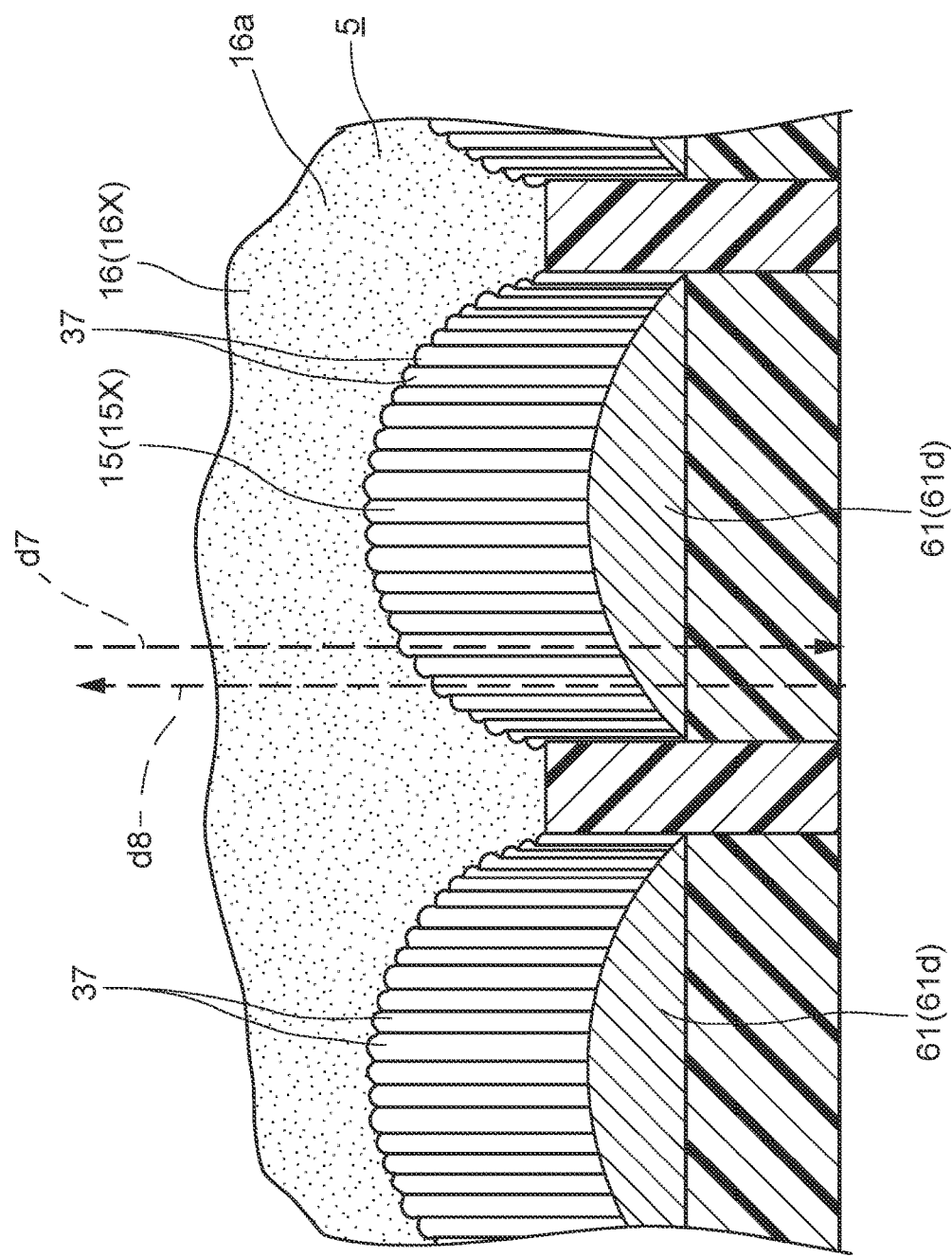
FIG. 14 is a perspective view showing a sectional surface corresponding to the line 14-14 in FIG. 13.

Next, an adhesive structure of the thin-film filter 5 will be explained with reference to FIG. 9 to FIG. 14, FIG. 15(b). FIG. 9 is a sectional view, with enlargement, showing the principal part of the thin-film filter 5 and the adhesive structure. FIG. 10 is a plan view showing the principal part of the thin-film filter 5 and the adhesive structure. FIG. 11 is a plan view, partially omitted with enlargement, showing the principal part in FIG. 10. FIG. 12 is a plan view, with enlargement, showing the peripheral part, of the sound hole 20b, which the thin-film filter 5 is adhered. FIG. 13 is a plan view, with more enlargement, showing the principal part, of the thin-film filter 5, arranged in the adhesive region. FIG. 14 is a perspective view showing a sectional surface corresponding to the line 14-14 in FIG. 13. FIG. 15(b) is a perspective view showing a principal part of the stripe-like part 37 of an adhesive through hole 15X.

As illustrated in FIG. 9, the thin-film filter 5 is adhered to a peripheral part of the sound hole 20b (also referred to "sound hole peripheral part") 20bb in the package surface 20a, so as to cover the sound hole 20b. Further, as illustrated in FIG. 12, a later-described photosensitive-adhesive layer 61 is formed in the sound hole peripheral part 20bb. The thin-film filter 5 is adhered to the sound hole peripheral part 20bb with the photosensitive-adhesive layer 61. The photosensitive-adhesive layer 61 has a hole formed structure, which a hole part 61a, having a little larger size than the sound hole 20b, is formed.

Then, as illustrated in FIGS. 10, 11, in the thin-film part 16 of the thin-film filter 5, the part, which is adhered to the sound hole peripheral part 20bb, is an adhesive region 16X, the part except for the adhesive region 16X, in the thin-film part 16, is a filter region 16Y. Because the adhesive region 16X is adhered to the sound hole peripheral part 20bb with the photosensitive-adhesive layer 61, it does not have a capability as a filter (filter-capability). To the contrary, because the filter region 16Y is arranged so as to struggle the sound hole 20b, it has the filter-capability.

Further, in the thin-film filter 5, a plurality of through holes 15 are formed in not only the filter region 16Y but also the adhesive region 16X. The through holes 15, which are formed in the filter region 16Y, are filter through holes 15Y. The through holes 15, which are formed in the adhesive region 16X, are adhesive through holes 15X. In FIGS. 10, 11, the through holes 15, which do not have hatching, are the filter through holes 15Y, the through holes 15, which have hatching, are the adhesive through holes 15X.

The filter through holes 15Y and the adhesive through holes 15X are hole parts which penetrate the thin-film part 16 from the film surface 16a to the rear film surface 16b. However, as illustrated in FIG. 9, FIG. 13, FIG. 14, because the thin-film filter 5 is adhered to the sound hole peripheral part 20*bb* with the photosensitive-adhesive layer 61, parts of the photosensitive-adhesive layer 61 enter the adhesive through holes 15X (parts of the adhesive through holes 15X, in the sound hole peripheral part 20*bb* side) as entering parts 61*d*. The structure, which parts of the photosensitive-adhesive layer 61 enter the adhesive through holes 15X as entering parts 61*d*, is an adhesive-layer-entering structure according to the present invention. The adhesive through holes 15X are stopped up on the sound hole peripheral part 20*bb* because of the adhesive-layer-entering structure.

Further, because the photosensitive-adhesive layer 61 enters the adhesive through holes 15X, the entering parts 61*d* of the photosensitive-adhesive layer 61 are adhered to the inner wall surface (the above-described stripes-formed inner wall surface 38, this will be explained in detail afterward) of the adhesive through holes 15X. As described-above, an adhesive strength, of the thin-film filter 5 to the package surface 20*a*, is enhanced by the adhesive through holes 15X. Note that because the photosensitive-adhesive layer 61 is used for the adhesion of the thin-film filter 5, it corresponds to a filer-adhesive layer in the present invention. The photosensitive-adhesive layer 61 is formed with photosensitive-adhesive. It is possible that an adhesive layer, using polyimide adhesive, epoxy adhesive, is formed as the filter-adhesive layer, instead of the photosensitive-adhesive layer 61. This will be explained in detail afterward.

Figure 15:
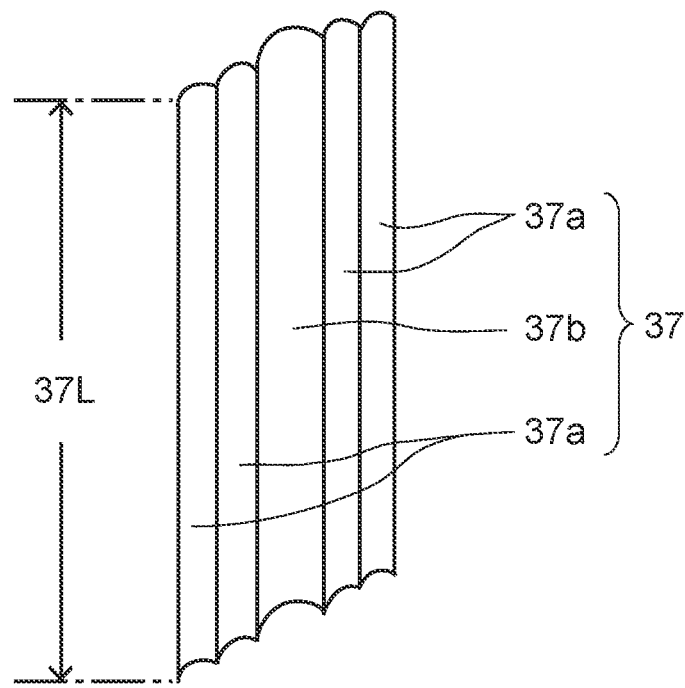
FIG. 15(a) is a perspective view showing a principal part of a stripe-like part.
FIG. 15(b) is a perspective view showing a principal part of the stripe-like part of an adhered through hole.
Figure 15:
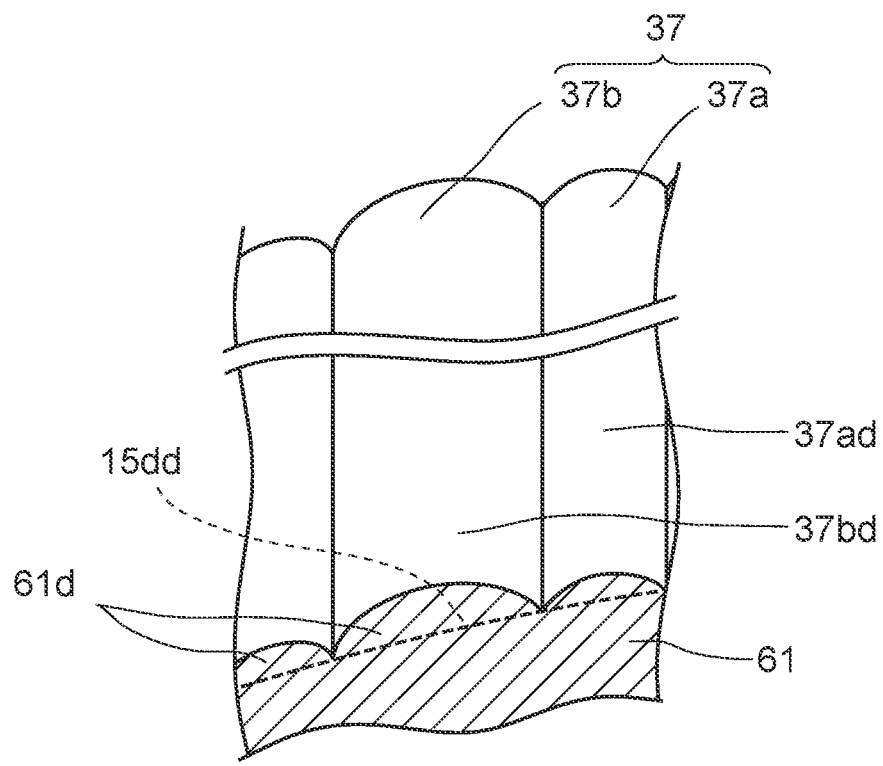

The above-described stripe-like parts 37 and the stripes-formed inner wall surfaces 38 are formed in both the filter through holes 15Y and the adhesive through holes 15X. As illustrated in FIG. 13, FIG. 14, the entering parts 61*d* of the photosensitive-adhesive layer 61 are adhered to the stripes-formed inner wall surfaces 38, in the adhesive through holes 15X. The stripe-like parts 37 are formed as concave parts, in the stripes-formed inner wall surfaces 38. Therefore, as illustrated in FIG. 15(*b*), the entering parts 61*d* enter inside of the stripe-like parts 37 (the concave curved surface parts 37*ad*, 37*bd* of the stripe-like parts 37*a*, 37*b*), thereby the entering parts 61*d* are adhered to the curved surface parts 37*ad*, 37*bd*. As illustrated in FIG. 15(*b*), because the entering parts 61*d* enter the curved surface parts 37*ad*, 37*bd* than a smooth inner wall surface 15*dd*, of the through holes 15 (the filter through holes 15Y, adhesive through holes 15X), which is supposed as the surface without the stripes-formed inner wall surfaces 38, the entering parts 61*d* are widely adhered.

(Method of Manufacturing the MEMS Package, the MEMS Microphone)

Figure 23:
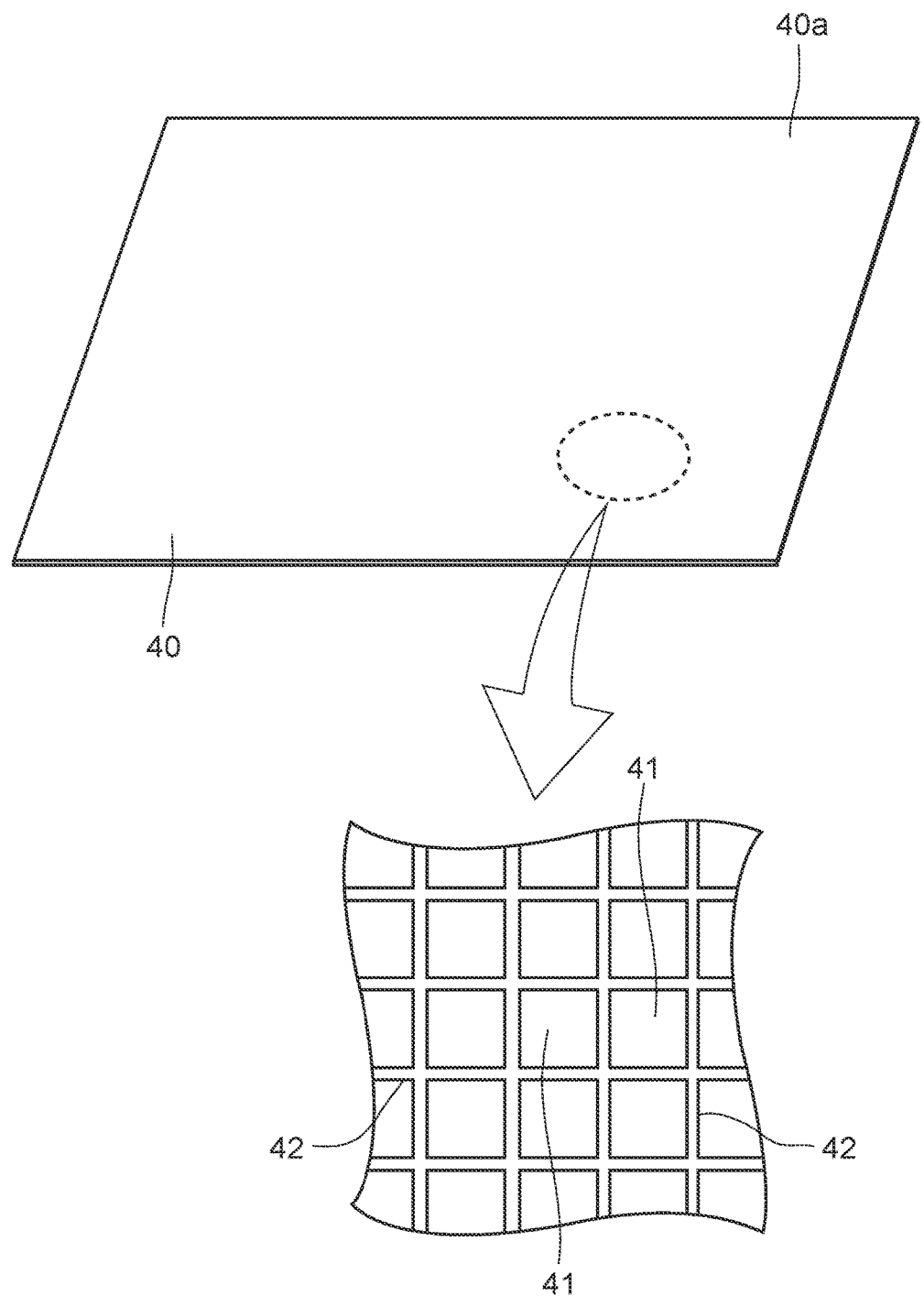
FIG. 23 is a perspective view showing a package-panel.
Figure 24:
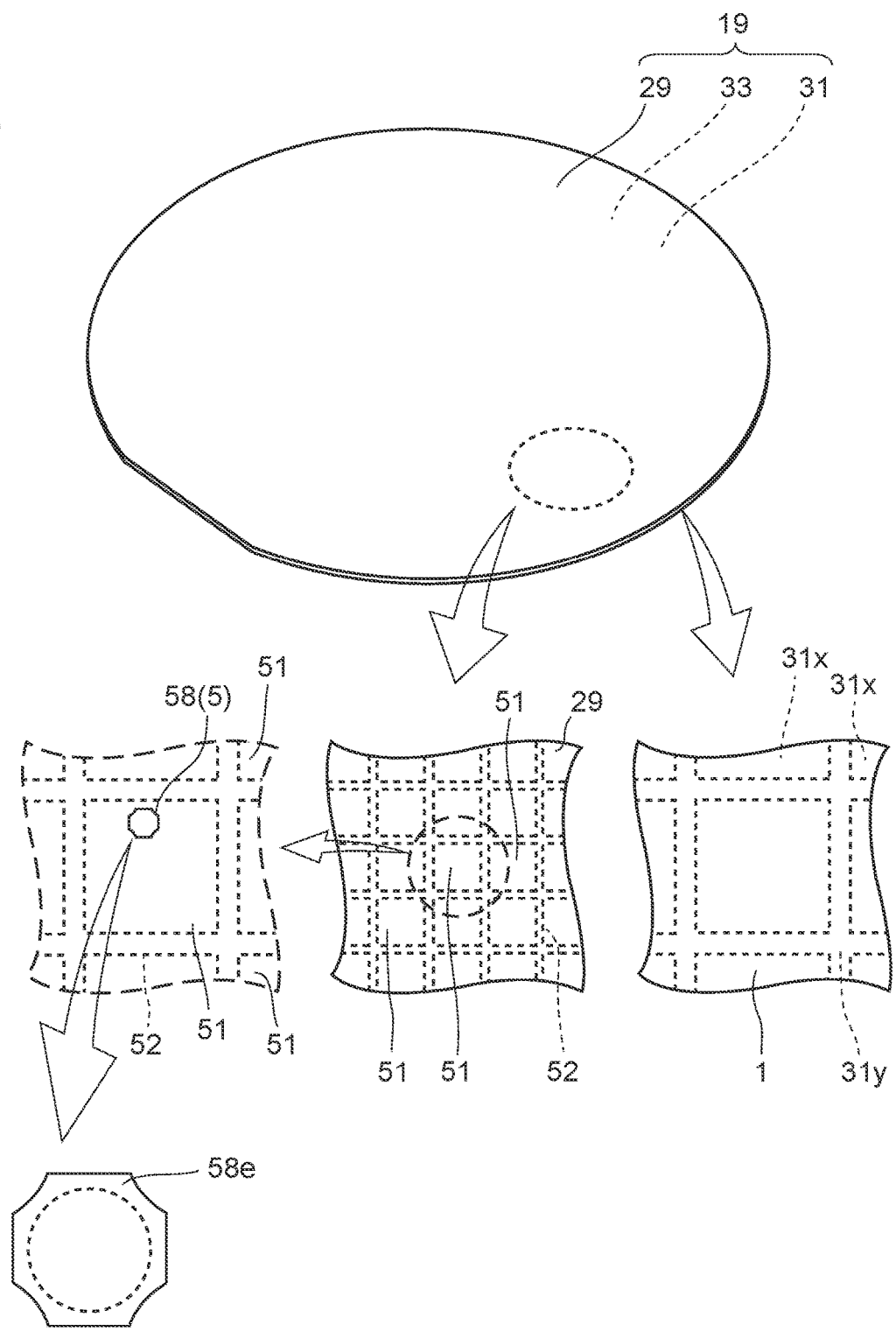
FIG. 24 is a perspective view showing a thin-film filter substrate.

Subsequently, the method of manufacturing the MEMS package 1, the MEMS microphone 100 having the above-described structure, will be explained with reference to FIG. 23 to FIG. 31. Here, FIG. 23 is a perspective view showing a later-described package-panel 40, FIG. 24 is a perspective view showing a later-described thin-film filter substrate 19. FIGS. 25-29 are sectional views respectively showing a principal part of a filter-adhesive layer forming step, a thin-film filter substrate manufacturing step, a thin-film filter peeling-off step, a thin-film filter transcribing step.

In the method of manufacturing the MEMS package 1, the MEMS microphone 100, the MEMS package 1, the MEMS microphone 100 are manufactured with the above-described MEMS chip 10, the ASIC 92 and the package substrate 20 which the MEMS chip 10 and the ASIC 92 are adhered. The method of manufacturing includes the later-described filter-adhesive layer forming step, the thin-film filter peeling-off step, the thin-film filter transcribing step. Further, the package substrate 20 is manufactured with the package-panel 40 illustrated in FIG. 23.

As illustrated in FIG. 23, the package-panel 40 is a board-like member, having rectangular shape, made of PCB or ceramic, and a plurality of package-regions 41 are formed on the surface 40*a* by a regular arrangement. When the package-panel 40 is divided along with divided lines 42, the package substrate 20 is manufactured from each of the package regions 41 (about 600 package substrates 20 are manufactured by every package-panel 40).

As illustrated in FIG. 24, the thin-film filter substrate 19 has a silicon wafer 31 (a substrate, made of glass, quartz or the like, is able to be used), a filter layer 29 and a peeling-off adhesive layer 33. The thin-film filter substrate 19 is manufactured by performing the later-described thin-film filter substrate manufacturing step.

Then the thin-film filter substrate 19 has a specific use which the thin-film filter substrate 19 is used for the MEMS microphone 100. Therefore, in case of the thin-film filter substrate 19, the silicon wafer 31 has a plurality of separative regions 31X, and the filter layer 29 has a plurality of separative regions 51.

A plurality of separative regions 31X are formed by a regular arrangement in accordance with the package regions 41 of the package-panel 40. The parts, between the respective separative regions 31X, are divided lines 31*y* in accordance with the divided lines 42. Further, a plurality of separative regions 51 are also formed by a regular arrangement in accordance with the package regions 41 of the package-panel 40. The parts, between the respective separative regions 51, are divided lines 52 in accordance with the divided lines 42. When the filter layer 29 is divided along with the divided lines 52, a plurality of separative regions 51 are formed. The thin-film filter 5 is formed from each of the respective separative regions 51. The above-described plurality of through holes 15 and the stripes-formed inner wall surfaces 38 are formed in the respective separative regions 51.

As illustrated in FIG. 24, filter parts 58 are arranged in the respective separative regions 51. The respective filter parts 58 becomes the above-described thin-film filter 5 afterward. Therefore, the respective filter parts 58 are formed in a modified rectangular shape in accordance with the thin-film filter 5.

(Thin-Film Filter Substrate Manufacturing Step)

A peeling-off adhesive layer forming step and a thin-film filter forming step are included in the thin-film filter substrate manufacturing step.

(Peeling-Off Adhesive Layer Forming Step)

Figure 26:
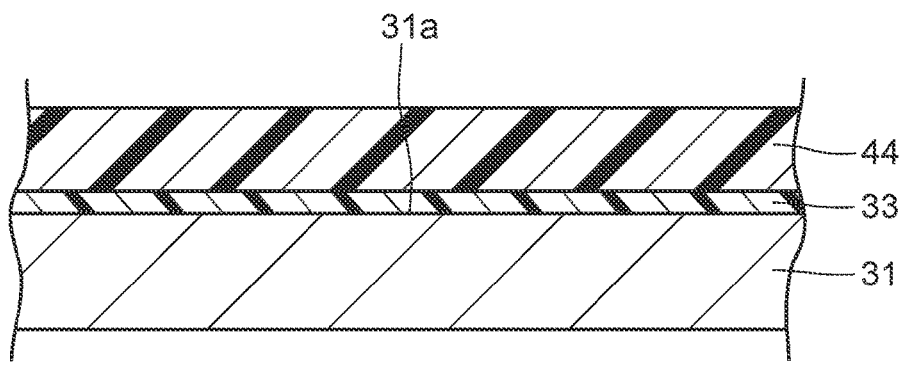
FIG. 26(a) is a sectional view showing a principal part of a peeling-off adhesive layer forming step.
FIG. 26(b) is a sectional view showing a principal part of a thin-film filter forming step.
Figure 26:
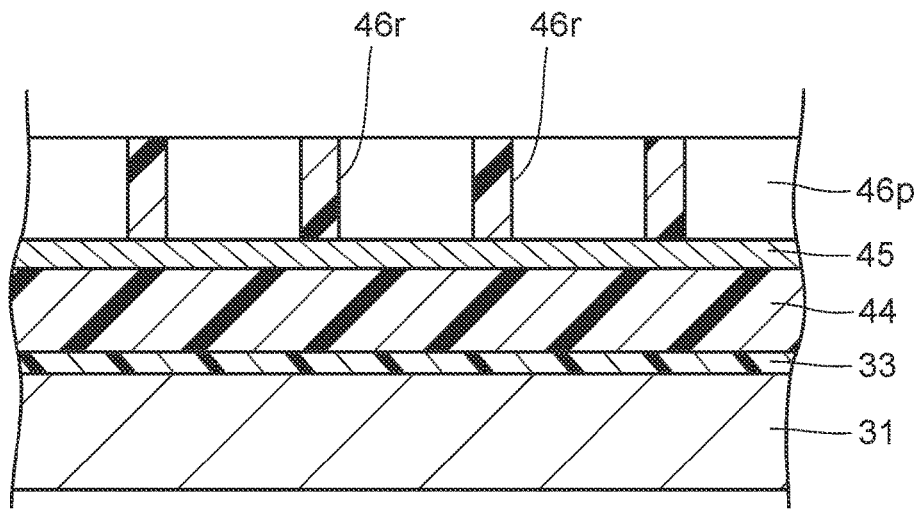
Figure 27:
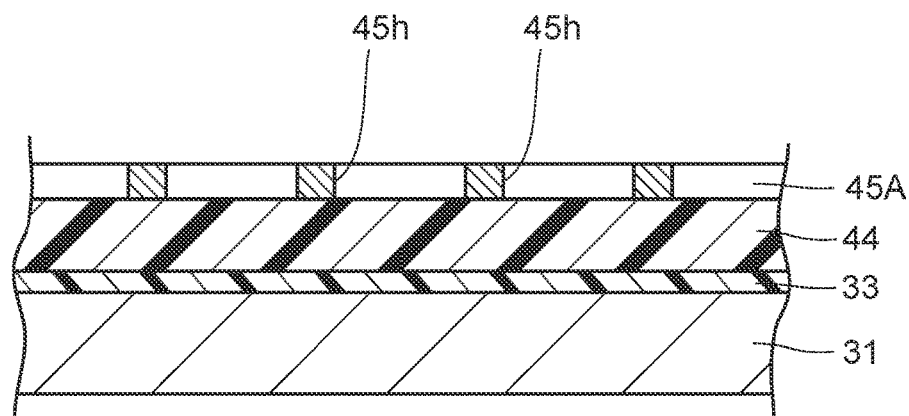
FIG. 27(a) is a sectional view of a principal part showing the manufacturing step subsequent that in FIG. 26(b)
FIG. 27(b) is a sectional view of a principal part showing the manufacturing step subsequent that in FIG. 27(a)
Figure 27:
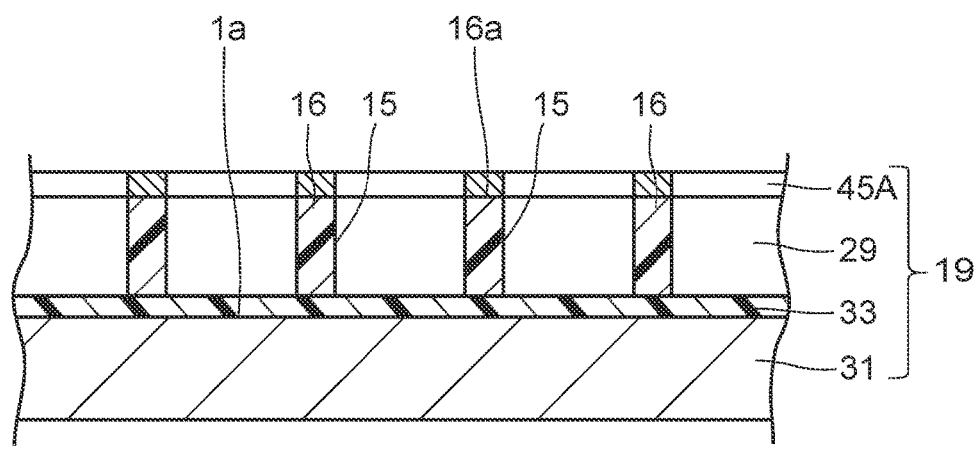

In the peeling-off adhesive layer forming step, the peeling-off adhesive layer 33 is formed on the silicon wafer 31. In this case, for example, a thermal-foaming tape is applied on a base surface 31*a* of the silicon wafer 31, as a base substrate. Then, as illustrated in FIG. 26(*a*), the peeling-off adhesive layer 33 is formed. Further, the thermal-foaming resin, not-illustrated, is applied on the base surface 31*a* of the silicon wafer 31, thereby the peeling-off adhesive layer 33 is able to be formed.

Resin and foaming agent are included in thermal-foaming resin. Thermal-foaming resin generates gas by heating to be able to foam. When the thermal-foaming resin is applied to form the thermal-foaming resin layer, the thermal-foaming resin layer becomes a thermal peeling-off layer, peeling-off by heating, and the peeling-off adhesive layer 33 is formed with the thermal peeling-off layer. Further, the thermal-foaming resin sheet, which the thermal-foaming resin is processed into a sheet-like form, is applied to be able to form the thermal-foaming resin layer. In this case, the peeling-off adhesive layer 33 is formed with the thermal-foaming resin sheet.

(Thin-Film Filter Forming Step)

Next, as illustrated in FIGS. 26(a), 26(b), FIGS. 27(a), 27(b), the thin-film filter forming step is performed to form the filter layer 29 on the peeling-off adhesive layer 33. A resin layer forming step, a metal layer forming step, a resist pattern forming step, a metal pattern forming step and a through hole forming step are included in the thin-film filter forming step.

At first, the resin layer forming step is performed. In the resin layer forming step, as illustrated in FIG. 26(a), a resin layer 44 is formed, with polyamide or polyimide film, on the peeling-off adhesive layer 33.

Next, the metal layer forming step is performed. In the metal layer forming step, as illustrated in FIG. 26(b), a metal layer 45 is formed, with Titanium (Ti), on the surface of the resin layer 44. The metal layer 45 is able to be formed, with SUS, Cr other than Titanium (Ti).

Subsequently, the resist pattern forming step is performed. In the resist pattern forming step, photoresist is applied on the surface of the metal layer 45. After that, an exposure is performed with not-illustrated photomask, further a development is performed, thereby a resist pattern 46p, having a plurality of hole parts 46r, is formed.

Next, a metal pattern forming step is performed. In the metal pattern forming step, a milling with Ar, to the metal layer 45, is performed with the resist pattern 46p as a mask (reactive ion etching is able to be performed, wet etching is also able to be performed). After that, the resist pattern 46p is removed. Then, as illustrated in FIG. 27(a), unnecessary parts of the metal layer 45 are removed to form corresponding hole parts 45h, corresponding to the hole parts 46r of the resist pattern 46p, on the metal layer 45. Thereby a metal pattern 45A is formed. The metal pattern 45A is formed by a pattern in accordance with the filter layer 29, being formed afterward.

Subsequently, the through hole forming step is performed. In the through hole forming step, reactive ion etching (RIE), to the resin layer 44, is performed, with the metal pattern 45A as a mask so that the stripes-formed inner wall surfaces 38 are formed. Then, as illustrated in FIG. 27(b), the parts, of the resin layer 44, which are not covered with the metal pattern 45A, are removed in accordance with the metal pattern 45A as unnecessary parts. The through holes 15 are formed on the parts which the unnecessary parts are removed. In this case, in the respective separative regions 51 of the resin layer 44, the through holes 15 are formed in peripheral parts 58e of the respective filter parts 58 and the inside areas (which become the above-described the filter regions 16Y afterward, they are also referred to filter planned regions). The peripheral parts 58e of the respective filter parts 58 are planned region, which will be adhered to the sound hole peripheral part 20bb afterward, and they correspond to an adhesion planned region, according to the present invention (see FIG. 24, concerning the peripheral part 58e).

Then, in case of reactive ion etching, etching proceeds by effects of both sputter operation with ion and chemical reaction. Therefore, in case of reactive ion etching, a perpendicular shape, not having under cut, is likely to be realized. Accordingly, a plurality of stripe-like parts 37 are formed inside the respective through holes 15, thereby the stripes-formed inner wall surfaces 38 are formed. In this way, after reactive ion etching (RIE) is performed, the filter layer 29, having the thin-film part 16, is able to be obtained from the resin layer 44.

Figure 28:
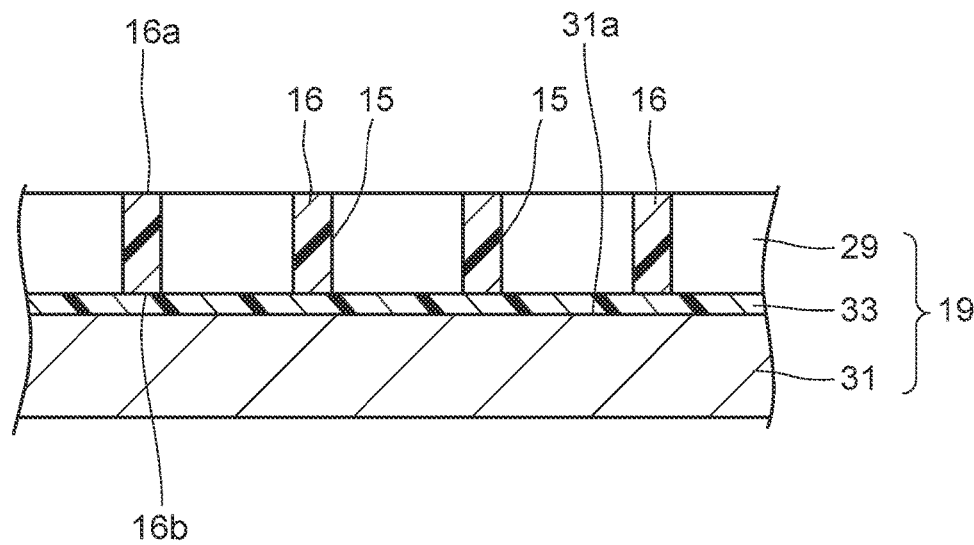
FIG. 28 is a sectional view showing an example of the thin-film filter substrate.

After the through hole forming step is performed, as the filter layer 29 illustrated in FIG. 28, the metal pattern 45A is sometimes removed through, the metal pattern 45A is sometimes left on the surface of the thin-film part 16 (the film surface 16a), as the filter layer 29 illustrated in FIG. 27(b). As described above, the thin-film filter substrate 19 is manufactured.

(Filter-Adhesive Layer Forming Step)

Figure 25:
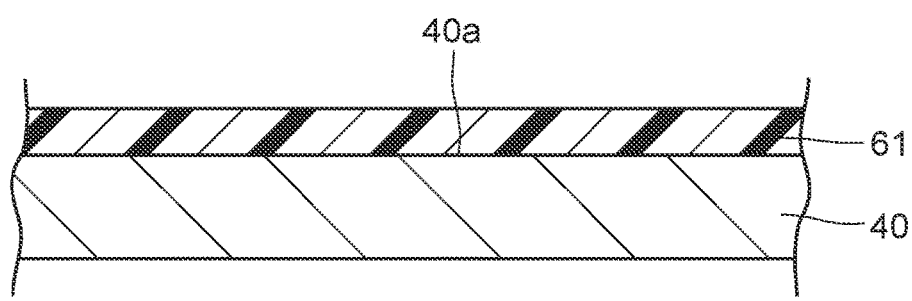
FIG. 25 is a sectional view showing a principal part of a filter-adhesive layer forming step.
Figure 29:
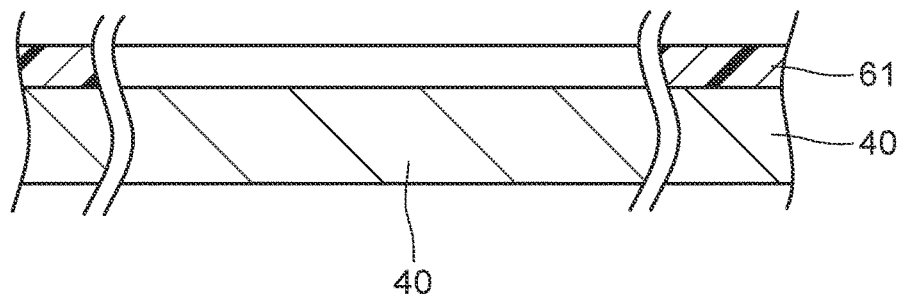
FIG. 29 is a sectional view showing another principal part of the filter-adhesive layer forming step.

In the filter-adhesive layer forming step, as illustrated in FIG. 25, the photosensitive-adhesive layer 61 is formed on the surface 40a of the package-panel 40. The photosensitive-adhesive layer 61 is formed by applying photosensitive polyimide adhesive sheet and so on. In this case, as illustrated in FIG. 29, the photosensitive-adhesive layer 61 is formed in a hole-formed structure. In the hole-formed structure, a part, which the sound hole 20b will be formed later, is removed. It is possible that the adhesive layer is formed with polyimide-based adhesive, epoxy resin-based adhesive, instead of the photosensitive-adhesive layer 61. The filter-adhesive layer will be formed with the photosensitive-adhesive layer 61 or the adhesive layers.

(Thin-Film Filter Peeling-Off Step)

Figure 30:
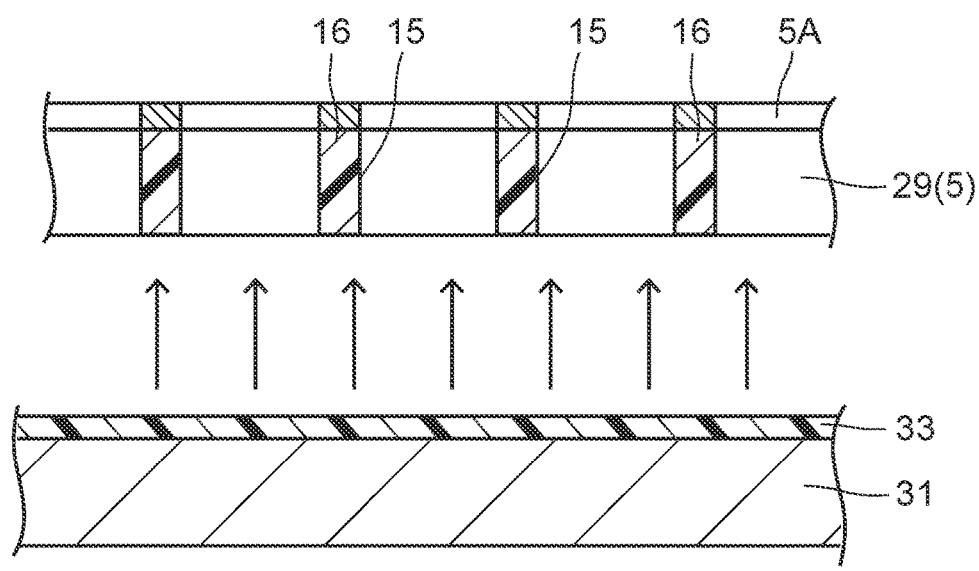
FIG. 30 is a sectional view showing a principal part of a thin-film filter peeling-off step.

In the thin-film filter peeling-off step, the thin-film filter substrate 19 is heated. Then, the peeling-off adhesive layer 33 is foamed by that heat. Therefore, as illustrated in FIG. 30, the filter-layer 29 is peeled-off from the peeling-off adhesive layer 33. Thereby the filter-layer 29 is manufactured.

(Thin-Film Filter Transcribing Step)

Figure 31:
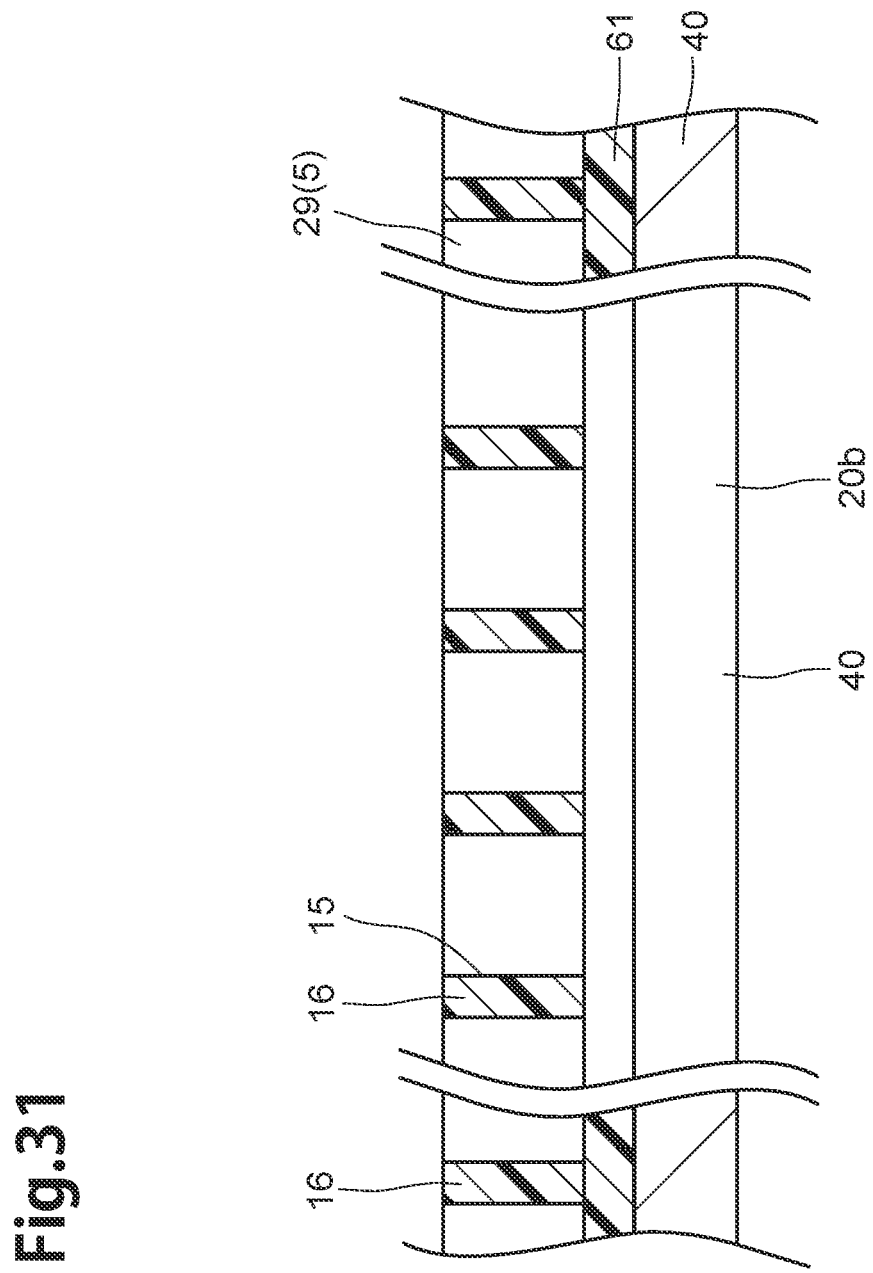
FIG. 31 is a sectional view showing a thin-film filter transcribing step.

Subsequently, the thin-film filter transcribing step is performed. In the thin-film filter transcribing step, the filter-layer 29, which is peeled-off from the thin-film filter substrate 19, is transcribed to the package-panel 40. In this case, as described above, because the photosensitive-adhesive layer 61 is formed on the surface 40a of the package-panel 40, as illustrated in FIG. 31, the filter-layer 29, which is peeled-off from the thin-film filter substrate 19, is laminated on the photosensitive-adhesive layer 61. Further, because a plurality of package-regions 41 are formed on the package-panel 40, in each package-region 41, unnecessary parts of the filter-layer 29 are removed with a laser-processing. In this case, in the respective package-regions 41, the filter parts 58 are saved, the other parts are removed.

Then, the peripheral parts 58e of the respective filter parts 58 are laminated on the photosensitive-adhesive layer 61, in the respective package regions 41. At this time, when the photosensitive-adhesive layer 61 is pasty at the normal temperature, parts of the surface of the photosensitive-adhesive layer 61 enter inside of the through holes 15, formed on the peripheral part 58e of the filter part 58 (the peripheral part 58e corresponds to an adhesive planned-region), thereby the above-described entering parts 61d will be formed. Further, when the photosensitive-adhesive layer 61 softens in the heating, the surface of the photosensitive-adhesive layer 61 softens in the heat when the package-panel 40 is heated, the parts enter inside the through holes 15, thereby the entering parts 61d are formed. Then, the through holes 15, which the entering parts 61d are formed, are formed as the above-described adhesive through holes 15X, and thereby the above-described adhesive-layer-entering structure is obtained.

As described above, in the thin-film filter transcribing step, the filter parts 58 are adhered to the respective package regions 41 for forming the package substrates 20 afterward.

In this way, the thin-film filters 5 are formed so as to respectively cover the sound holes 20b.

(Other Steps)

Figure 32:
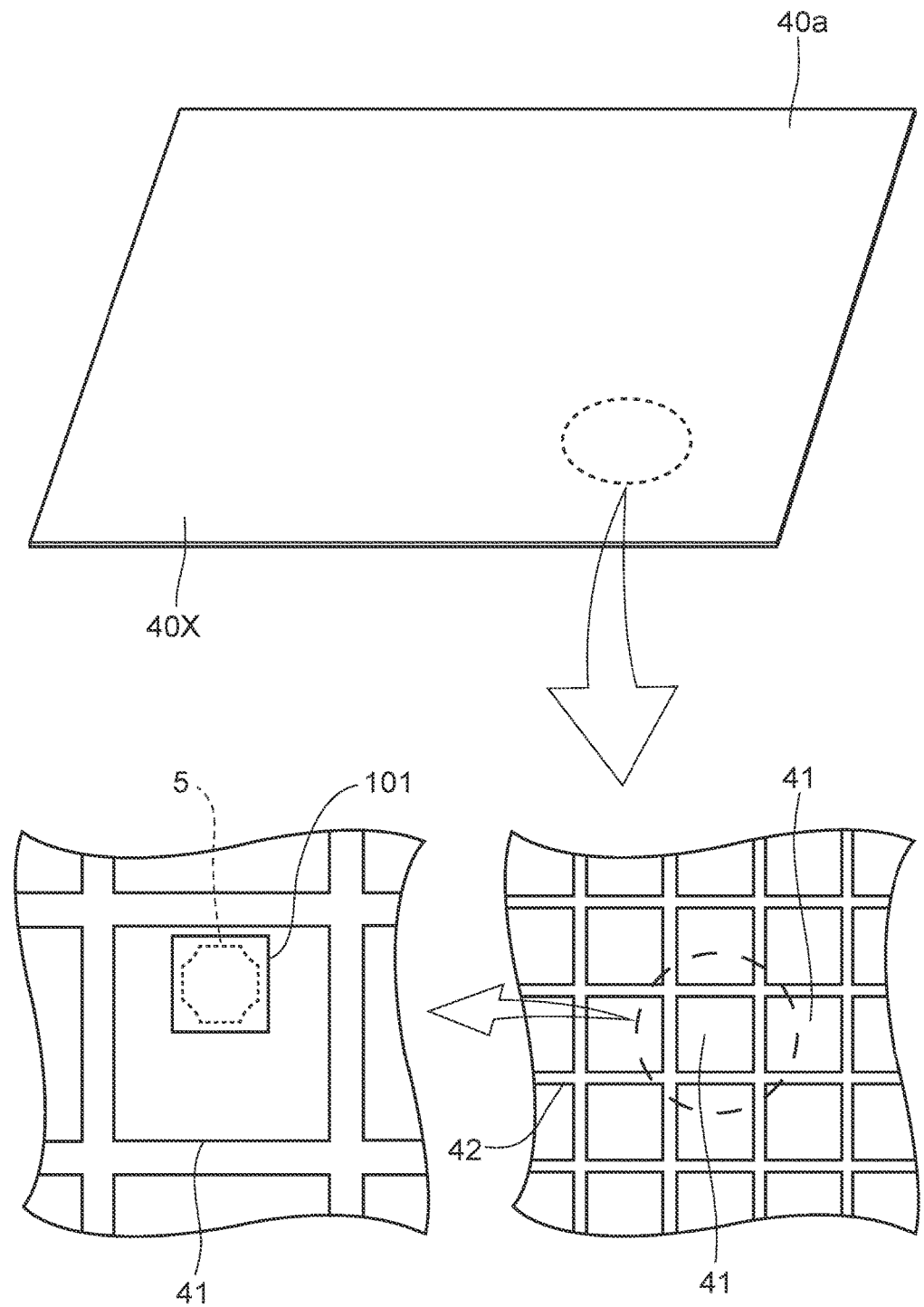
FIG. 32 is a perspective view showing a panel-with-chip.

After that, the MEMS chip mounting step is performed. In the MEMS chip mounting step, the electrode pads 7 are formed on the MEMS chip 10, further the solder bumps are formed. After that, in the package-panel 40, the MEMS chips 10 are mounted respectively on the package-regions 41 by the flip chip bonding with solder bumps to form a panel-with-chip 40X (see FIG. 32). The panel-with-chip 40X is put into the not-illustrated heating reflow furnace. Then the solder bumps become the bonding bumps 4 after melting. After that, the sound shield 6 is formed (the sound shield 6 is sometimes formed before the MEMS chips 10 are mounted).

After that, the ASIC 92 is mounted on the package-region 41, further the cap 99 is adhered. Note that a package reflow is able to be performed about both the MEMS chip 10 and ASIC 92, when the ASIC 92 is mounted on the panel-with-chip 40X.

Furthermore, a panel cutting step is performed. In the panel cutting step, the panel-with-chip 40X, which the MEMS chip 10 and ASIC 92 are mounted further the cap 99 is covered, is cut along with the divided lines 42 to be divided into the respective package-regions 41. Then, the panel-with-chip 40X is divided into a plurality of package-regions 41. The MEMS package 1, the MEMS microphone 100 are manufactured together with the package substrate 20 from the respective package-regions 41. The above-described thin-film filter 5 is adhered to the manufactured package substrate 20.

(Operation and Effect of the MEMS Package, the MEMS Microphone)

Because, the thin-film filter 5 is adhered to the MEMS package 1 and the MEMS microphone 100, the particles, water are prevented from entering by the thin-film filter 5. The thin-film part 16 of the thin-film filter 5 is formed in a thin-film like shape having an extremely thin thickness. However, the through holes 15 (adhesive through holes 15X) are formed in the adhesive region 16X, which is adhered to the package substrate 20. Therefore, the photosensitive-adhesive layer 61, which is used for the adhesion, is in contact with the inner surfaces of the through holes 15 (adhesive through holes 15X), with the condition of the thin-film filter 5, adhered to the package substrate 20, thereby the structure, which the photosensitive-adhesive layer 61 is engaged with the through holes 15 (adhesive through holes 15X), is obtained. Therefore, the adhesion strength of the thin-film filter 5 is extremely enhanced as compared with the case, when a smooth surface, not having the through holes, is adhered to the package substrate 20.

Further, because the parts of the photosensitive-adhesive layer 61 enter inside of the through holes 15 (adhesive through holes 15X), as the entering parts 61d, an anchor effect of the photosensitive-adhesive layer 61 is obtained, thereby the adhesion strength is further enhanced.

Not only the photosensitive-adhesive layer 61 is adhered to the adhesive region 16X but also the entering parts 61d, being the parts of the photosensitive-adhesive layer 61, are adhered to the inner wall surface (the stripes-formed inner wall surface 38) of the through holes 15 (adhesive through holes 15X). Therefore, the contacting area of the photosensitive-adhesive layer 61 and the thin-film filter 5 is enlarged, thereby the adhesion strength is furthermore enhanced.

On the other hand, a plurality of through holes 15 are formed in the thin-film filter 5, and the stripes-formed inner wall surfaces 38 are formed in the inside of the respective through holes 15. Therefore, the contact areas between the photosensitive-adhesive layer 61 and the inner wall surfaces of the through holes 15 are enlarged, as compared with the case which the inner wall surfaces of the through holes 15 are smooth surfaces. Therefore, the anchor effect of the photosensitive-adhesive layer 61 is enlarged, thereby the adhesion strength is furthermore enhanced.

Then, a plurality of through holes 15 are formed in the thin-film filter 5, and the stripes-formed inner wall surfaces 38 are formed in the inside of the respective through holes 15. A plurality of through holes 15 are formed with reactive ion etching so as to form the stripes-formed inner wall surfaces 38. Therefore, in the thin-film filter 5, lowering the filter-capability originated in the manufacturing steps, for example, such as hole blocking up by the adhesion of debris or the like, is never occurred. Further, durability of the thin-film filter 5 is also good.

The stripes-formed inner wall surfaces 38 have respectively a plurality of stripe-like parts 37, the stripe-like parts 37 are formed along with the intersecting direction. Then, when air passes through the thin-film filter 5, the stream of air (passing stream) passes through inside the through holes 15 (the filter through holes 15Y), in the direction along with the stripe-like parts 37 (direction shown by "d7", "d8" in FIG. 8). Namely, because the stripe-like parts 37 have a capability as a guide member, which adjusts a motion of the passing stream, passing through the through holes 15 (the filter through holes 15Y), in the intersecting direction, air stream, along with the direction different from the direction shown by d7, d8, is not formed. Therefore, peripheral parts of the respective through holes 15 (the filter through holes 15Y) are hardly affected by the passing stream, and they are hardly damaged. Because the thin-film filter 5 has a structure, which the passing stream passes through in the fixed direction, durability of the thin-film filter 5 is good.

Further, in the thin-film filter 5, hole forming process for the through holes 15 are performed by reactive ion etching. In reactive ion etching, etching proceeds by effect of both sputter operation with ion and chemical reaction. In this case, removed material (polyimide and so on, in case of the thin-film filter 5) is turned into volatile matter, and vacuum exhaust, including it, is performed. Therefore, production of debris and adhesion of debris are never occurred. Therefore, hole size of the respective through holes 15 never become uneven. Accordingly, in the thin-film filter 5, lowering the filter-capability, originated in the manufacturing process, is never occurred, durability of the thin-film filter 5 is also good.

In case of the thin-film filter 5, because the stripe-like parts 37 are arranged in almost the whole of the inner surface of the respective through holes 15, almost the whole of the inner wall surface of the through holes 15 are guide member, durability of the thin-film filter 5 is good. Further, because the stripe-like parts 37 are formed in the size larger than 80% of the film thickness T, disturbance of the passing stream is not likely to occur, therefore the stripe-like parts 37 are good guide members.

Then, in the thin-film filter 5, the centers of the through holes 15, included in the second through hole-group 15B, are arranged between the centers of the adjacent through holes 15, included in the first through hole-group 15A. Therefore, in the thin-film filter 5, there is no waste in the arrangement of through holes 15. Further, the path of the air is secured effectively. Further, because the thin-film filter 5 has the high-density structure, the arrangement of through holes 15 is more effective.

On the other hand, because the thin-film filter 5 (the filter layer 29) is a member mainly having the thin-film part 16, made of polyamide or polyimide, it is difficult to handle the thin-film filter 5 separately. However, in case of the thin-film filter substrate 19, because it has the silicon wafer 31, being formed in a plane shape, handling of the thin-film filter substrate 19, such as conveyance, storage or the like, is easy.

Moreover, because the thin-film filter substrate 19 has the peeling-off adhesive layer 33, the filter layer 29 is peeled off from the silicon wafer 31, if necessary, thereby the filter layer 29 is able to be separated. The film layer 29 is attached to a desired product, thereby the filter-capability, that is demanded to the product, is exhibited. Therefore, the thin-film filter substrate 19 is very handy. Further, after the film layer 29 is removed, the silicon wafer 31 is able to be used again, as the base substrate which the filter layer 29 is formed, thereby a waste of materials and resources decreases.

(First Modified Example of the Thin-Film Filter)

Figure 16:
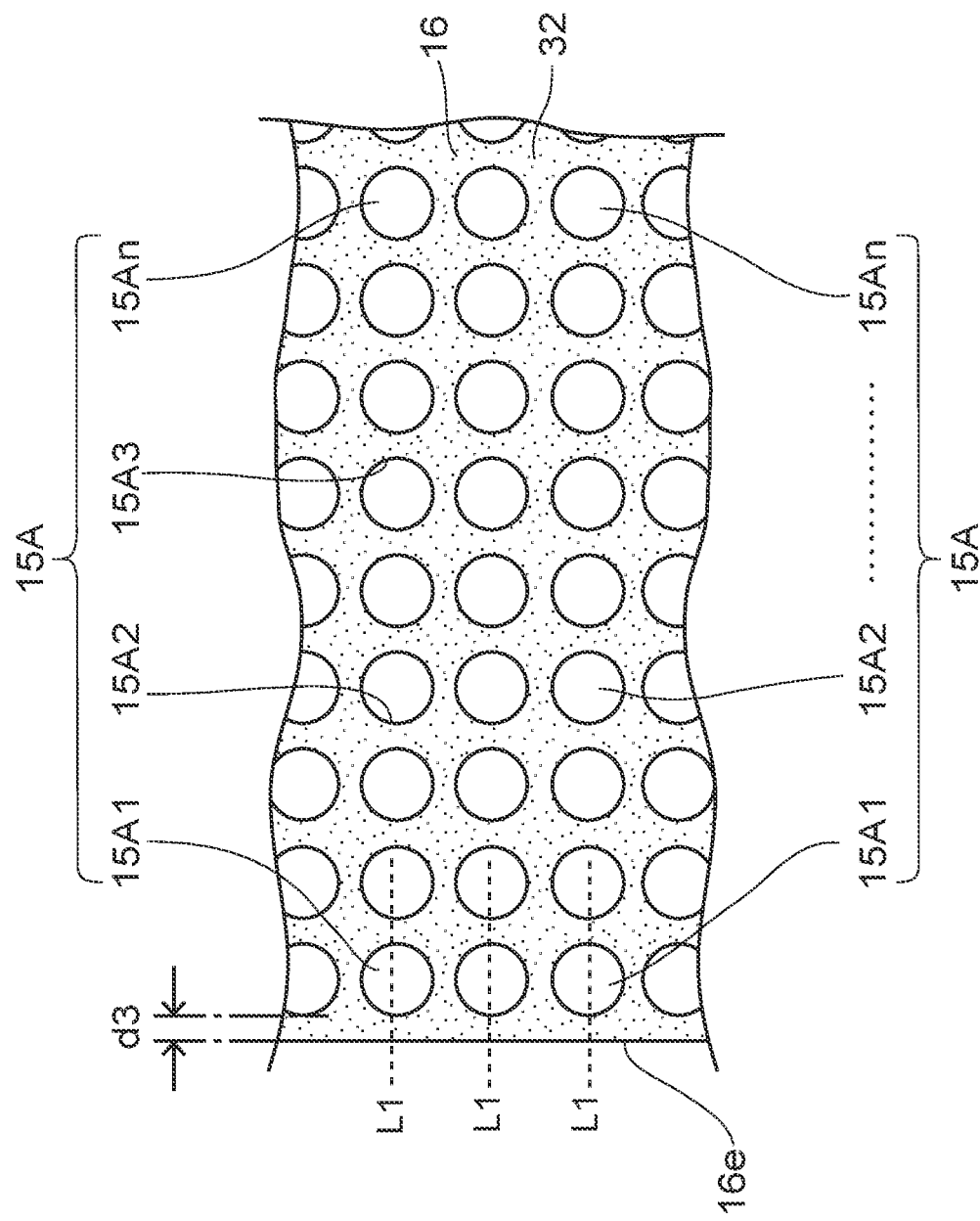
FIG. 16 is a plan view, with enlargement, of the principal part of the thin-film filter according to the first modified example.
Figure 17:
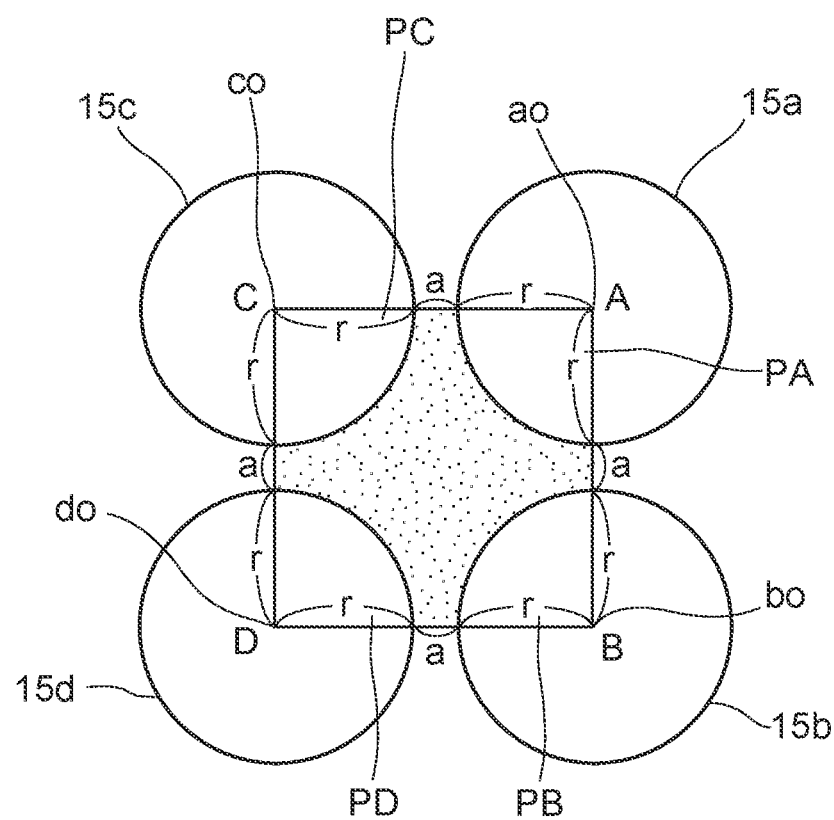
FIG. 17 is a plan view of the part, including a representative through holes, of the thin-film filter according to the first modified example.

Next, the thin-film filter 32, according to a first modified example, is explained with reference to FIG. 16, FIG. 17. FIG. 16 is a plan view showing a principal part of the thin-film filter 32 according to the first modified example. FIG. 17 is a plan view showing a part, including representative through holes 15a, 15b, 15c, 15d, of the thin-film filter 32.

The thin-film filter 32 is different in that it has the first through hole-group 15A though, and it does not have the second through hole-group 15B, as compared with the thin-film filter 5. Because the thin-film filter 32 does not have the second through hole-group 15B, a plurality of first lines L1 are arranged. Further, the first through hole 15A1, through holes 15A2, 15A3 . . . 15An, included in the each first line L1, are arranged at a constant interval in a straight line along with the direction intersecting vertically to the peripheral end part 16e. Furthermore, a plurality of first through holes 15A1, included in the each first line L1, are arranged at a constant interval in a straight line along with the peripheral end part 16e (similar with the through holes 15A2, 15A3 . . . 15An). All intervals between the first through holes 15A1 and the peripheral end part 16e are set an end-interval d3 having constant value.

In case of the thin-film filter 32, as illustrated in FIG. 17, the adjacent four through holes 15a, 15b, 15c, 15d are set as the representative through holes. The centers of the through holes 15a, 15b, 15c, 15d are a0, b0, c0, d0.

A rectangular ABCD is a rectangular, which the centers a0, b0, c0, d0, of a plurality of adjacent through holes 15(15a, 15b, 15c, 15d) included in the adjacent two first through hole-groups 15A are vertexes and the rectangular ABCD is a square, according to the regularity of the arrangement of the through holes 15.

The thin-film filter 32 has a plurality of through holes 15, similar with the thin-film filter 5, and the thin-film filter 32 is able to be manufactured by the same manufacturing method as the thin-film filter 5. The thin-film filter 32 has also the adhesive region and the filter region, the through holes 15 are formed both the adhesive region and the filter region. Further, the stripes-formed inner wall surfaces 38, similar with the thin-film filter 5, are formed inside the respective through holes 15 by reactive ion etching (not illustrated in FIG. 16, FIG. 17). Therefore, the thin-film filter 32, and the MEMS package, MEMS microphone (not illustrated), which the thin-film filter 32 is formed instead of the thin-film filter 5, have the same operation and effect as the above-described thin-film filter 5, the MEMS package 1, MEMS microphone 100.

(Second Modified Example of the Thin-Film Filter)

Figure 18:
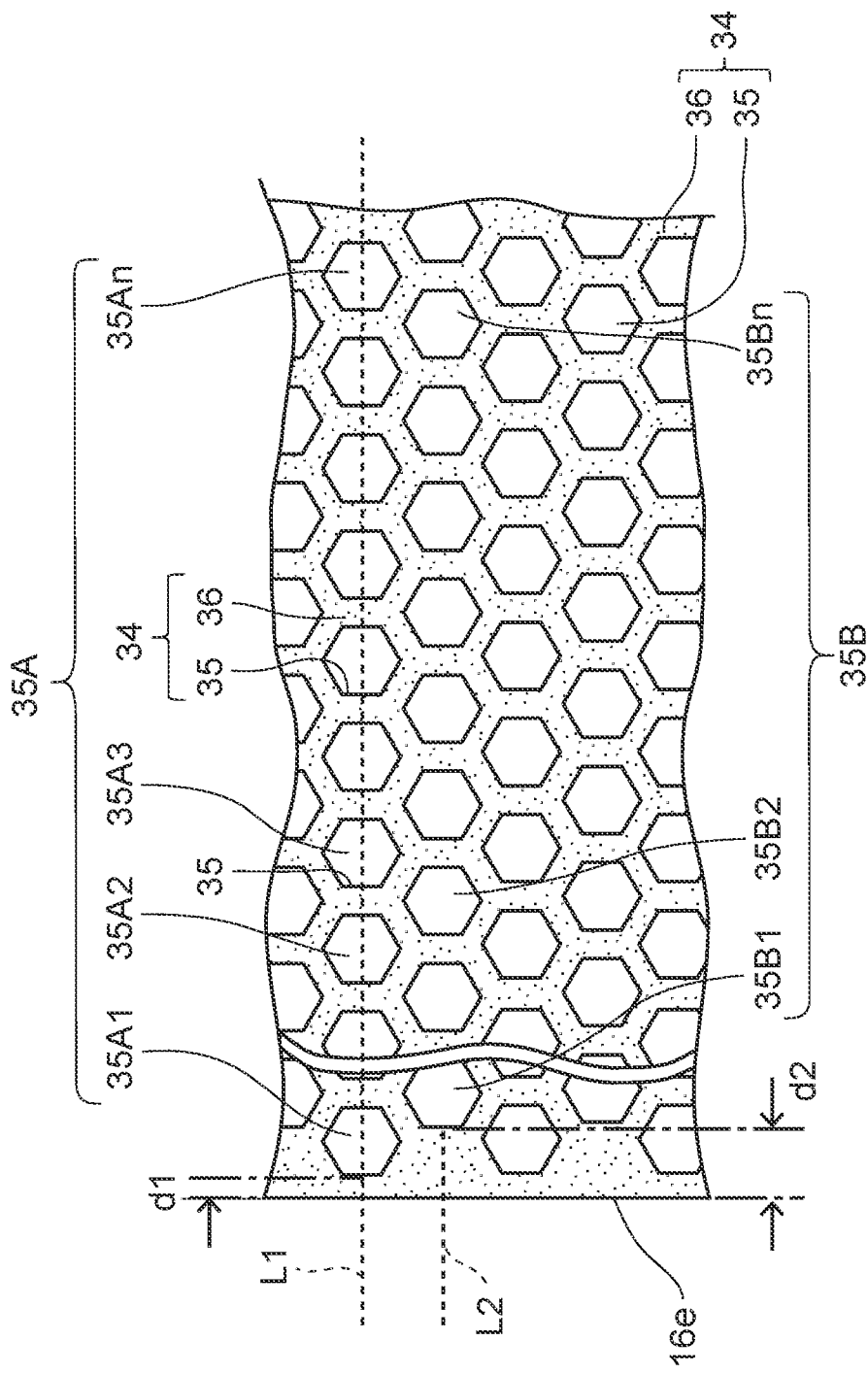
FIG. 18 is a plan view, with enlargement, of the principal part of the thin-film filter according to the second modified example.
Figure 19:
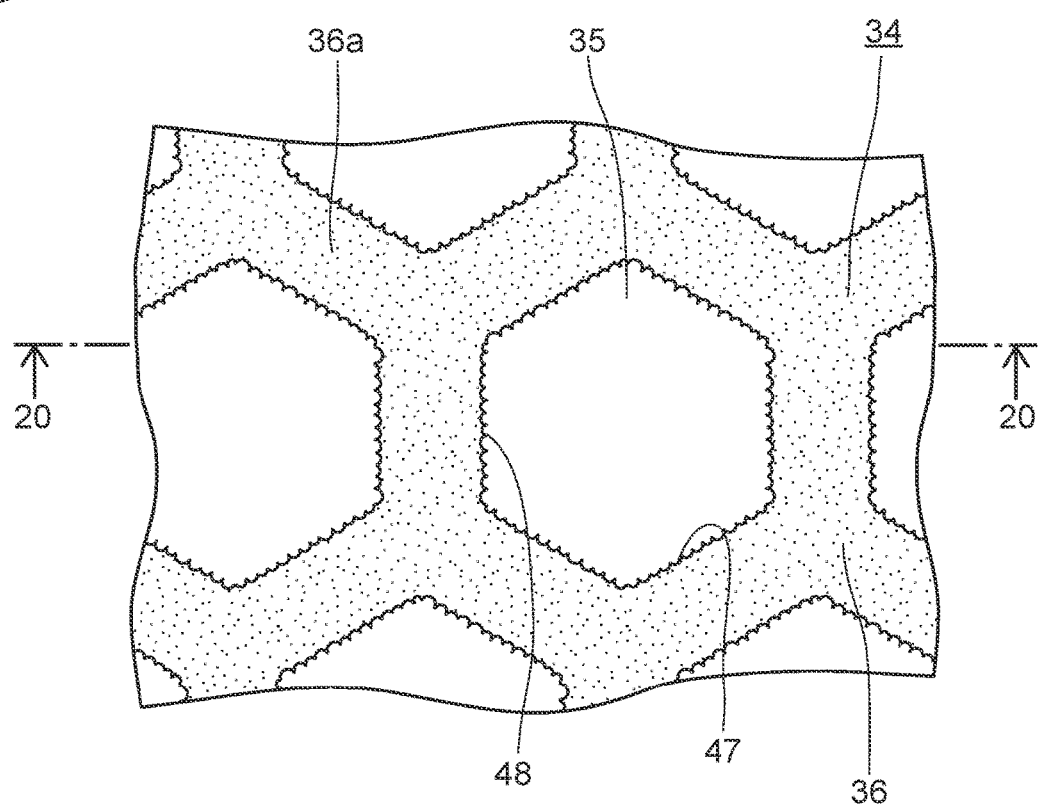
FIG. 19 is a plan view, with more enlargement, of the principal part of the thin-film filter according to the second modified example.
Figure 20:
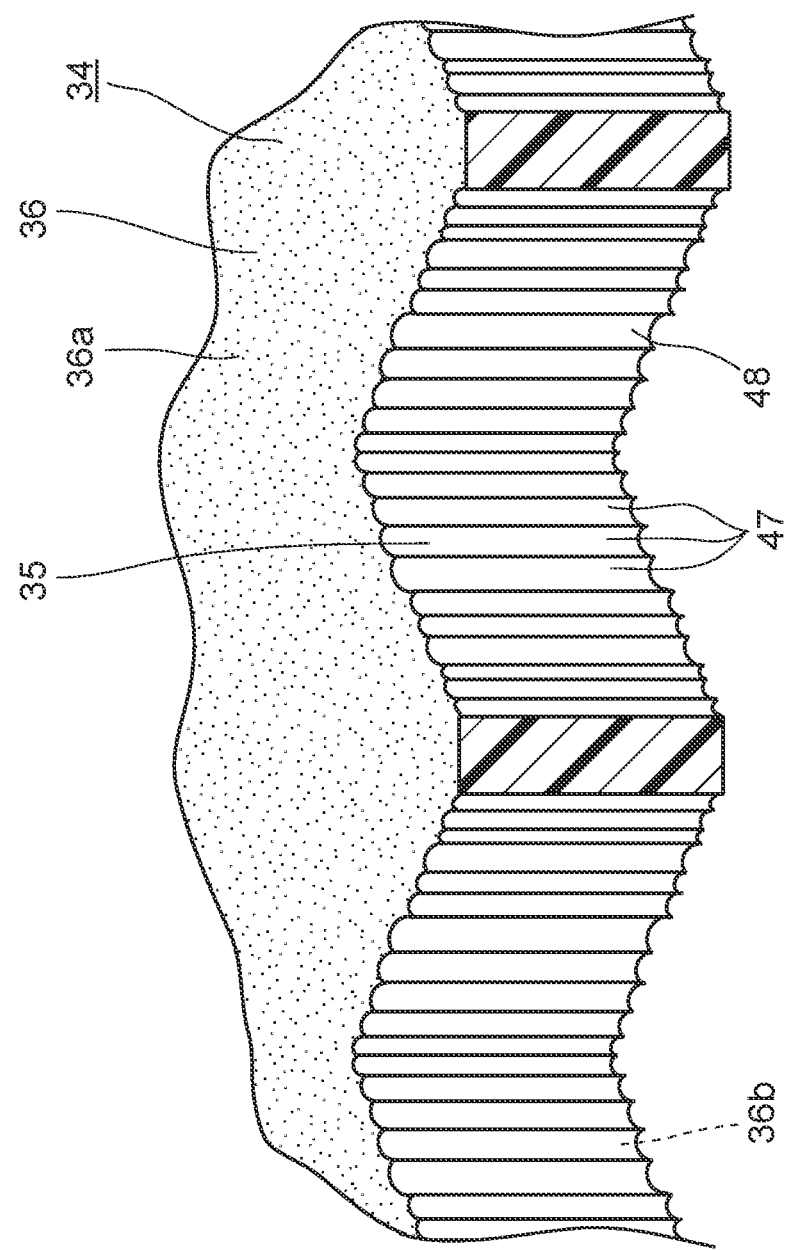
FIG. 20 is a perspective view showing a sectional surface corresponding to the line 20-20 in FIG. 19.

Next, the thin-film filter 34, according to a second modified example, is explained with reference to FIG. 18, FIG. 19, FIG. 20. FIG. 18 is a plan view, with enlargement, of the principal part of the thin-film filter 34 according to the second modified example. FIG. 19 is a plan view, with more enlargement, of the principal part of the thin-film filter 34. FIG. 20 is a perspective view showing a sectional surface corresponding to the line 20-20 in FIG. 19.

The thin-film filter 34 is different in that it has a thin-film part 36 instead of the thin-film part 16, and the through holes 35 are formed instead of the through holes 15, as compared with the thin-film filter 5. The thin-film part 36 is different in that the through holes 35 are formed, as compared with the thin-film part 16.

The above-described through holes 15 are formed in a circular shape in a plan view though, the through holes 35 are formed in a regular hexagon in a plan view. The thin-film filter 34 has a first through hole-group 35A and a second through hole-group 35B. A plurality of through holes 35, including a first through hole 35A1, through holes 35A2, 35A3 . . . through hole 35An, are included in the first through hole-group 35A. The first line L1, similar with the first through hole-group 15A, is formed by the first through hole 35A1, through holes 35A2, 35A3 . . . 35An.

A plurality of through holes 35, including a second through hole 35B1, through holes 35B2, 35B3 . . . through hole 35Bn are included in the second through hole-group 35B. The second line L2, similar with the second through hole-group 15B, is formed by the second through hole 35B1, through holes 35B2, . . . 35Bn. In case of the thin-film filter 34, the triangle, which the centers of the adjacent three through holes 35 (for example, through holes 35A2, 35A3, 35B3) are vertexes, is a regular triangle, according to the regularity of the arrangement of the through holes 35.

Then, in case of the thin-film filter 34, as illustrated in FIG. 19, FIG. 20, the stripes-formed inner wall surfaces 48 are formed inside the respective through holes 35. The stripes-formed inner wall surfaces 48 have a plurality of stripe-like parts 47. A plurality of stripe-like parts 47 are arranged in almost the whole of the inner wall surface of the respective through holes 35, similar with a plurality of stripe-like parts 37. The stripes-formed inner wall surfaces 48 are formed in almost the whole of the inner wall surface of the respective through holes 35. The stripe-like parts 47 are formed along with the intersecting direction, similar with the stripe-like parts 37. Further, the respective stripe-like parts 47 are convex parts or concave parts, formed on the inner wall surface of the respective through holes 35, approximately in the straight line along with the intersecting direction.

The thin-film filter 34 has a plurality of through holes 35. The thin-film filter 34 is able to be manufactured with the same manufacturing method with the thin-film filter 5. The thin-film filter 34 has also the adhesive region and the filter region, the through holes 35 are formed both the adhesive region and the filter region. Further, the stripe-like parts 47 and the stripes-formed inner wall surfaces 48, respectively similar with the stripe-like parts 37 and the stripes-formed inner wall surfaces 38 of the respective through holes 15, are formed in the respective through holes 35. Therefore, the thin-film filter 34, and the MEMS package, MEMS microphone (not illustrated), which the thin-film filter 34 is formed instead of the thin-film filter 5, have the same operation and effect as the above-described thin-film filter 5, the MEMS package 1, MEMS Microphone 100.

(Third Modified Example of the Thin-Film Filter)

Figure 21:
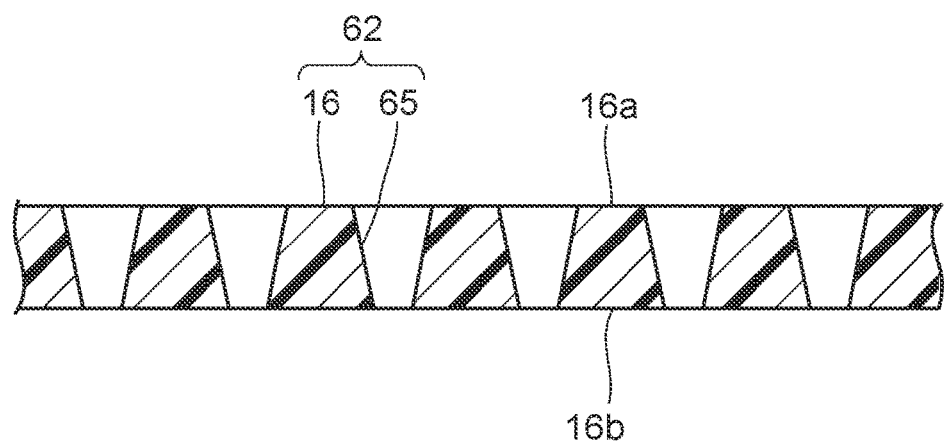
FIG. 21 is a sectional view, corresponding to FIG. 6, showing the thin-film filter according to the third modified example.

Next, the thin-film filter 62, according to a third modified example, is explained with reference to FIG. 21. Here, FIG. 21 is a sectional view, corresponding to FIG. 6, of the thin-film filter 62 according to the third modified example.

The thin-film filter 62 is different in that it has through holes 65 instead of the through holes 15, as compared with the thin-film filter 5. In case of the through holes 15, they respectively have fixed size diameters from the film surface 16a to the rear film surface 16b. To the contrary, in case of the through holes 65, the diameters are gradually reduced from the film surface 16a to the rear film surface 16b. The thin-film filter 62 has also the adhesive region and the filter region similar with the thin-film filter 5, the through holes 65 are formed both the adhesive region and the filter region. Further, because the stripes-formed inner wall surfaces 38 are formed in the respective through holes 65 (not illustrated in FIG. 21), similar with the through holes 15. Therefore, the thin-film filter 62, and the MEMS package, MEMS microphone (not illustrated), which the thin-film filter 62 is formed instead of the thin-film filter 5, have the same operation and effect as the above-described thin-film filter 5, the MEMS package 1, MEMS Microphone 100.

(Fourth Modified Example of the Thin-Film Filter)

Figure 22:
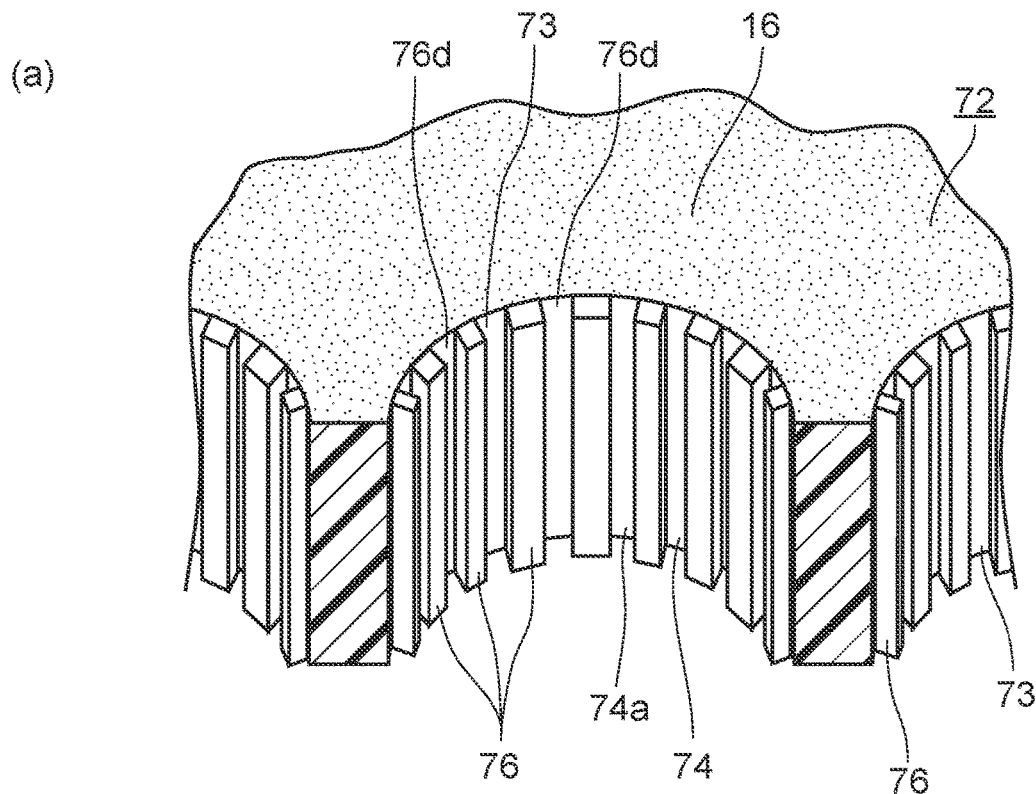
FIG. 22(a) is a perspective view, corresponding to FIG. 8, showing the thin-film filter according to the fourth modified example.
FIG. 22(b) is a plan view, partially omitted, showing a principal part of the adhered through hole of the thin-film filter.
Figure 22:
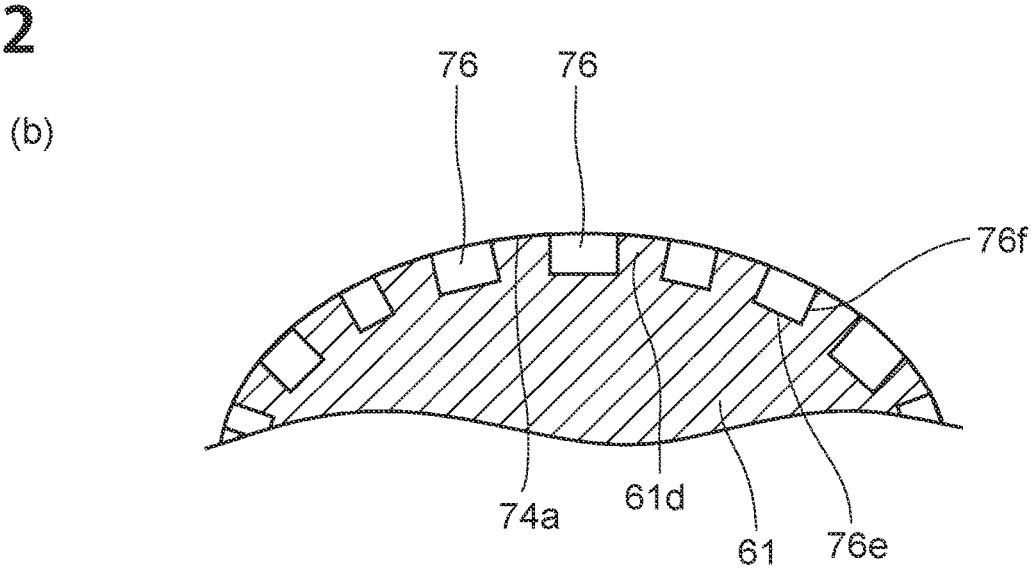

Next, the thin-film filter 72, according to a fourth modified example, is explained with reference to FIG. 22(a), FIG. 22(b). FIG. 22(a) is a perspective view of the thin-film filter 72 according to the fourth modified example. FIG. 22(b) is a plan view, partially omitted, showing a principal part of the adhesive through hole of the thin-film filter 72.

The thin-film filter 72 is different in that it has through holes 73 instead of the through holes 15, as compared with the thin-film filter 5. Further, in case of the thin-film filter 72, the stripes-formed inner wall surfaces 74 are formed in the respective through holes 73.

In case of the above-described stripes-formed inner wall surfaces 38, the stripe-like parts 37 are formed closely so that a smooth part does not remain in the inner wall surface of the respective through holes 15. To the contrary, in case of the stripes-formed inner wall surfaces 74, stripe-like convex parts 76 are formed discretely at interval 76d so that a smooth part (smooth-faced part) remains in the inner surface of the respective through holes 73. Therefore, parts between the respective stripe-like convex parts 76 remain as smooth-faced parts 74a. The stripe-like convex parts 76 are convex parts formed in the inner surface of the through holes 73, and they are formed in about straight line along with the intersecting direction. Therefore, the passing stream passes through in the fixed direction by the stripe-like convex parts 76 of the stripes-formed inner wall surfaces 74, the thin-film filter 72 have the same operation and effect, similar with the thin-film filter 5.

Further, the thin-film filter 72 has also the adhesive region and the filter region, the through holes 73 are formed both the adhesive region and the filter region similar with the thin-film filter 5. In case of the through holes 73, the stripe-like convex parts 76 are formed. Therefore, as illustrated in FIG. 22(b), parts of the photosensitive-adhesive layer 61 enter inside between the adjacent to the stripe-like convex parts 76, as the entering parts 61d. Then, the entering parts 61d are in contact with the smooth-faced parts 74a of the stripes-formed inner wall surfaces 74 and protruding surfaces which are protruding than the smooth-faced parts 74a (protruding side surfaces 76e, 76f of the stripe-like convex parts 76). Therefore, also in case of the thin-film filter 72, because enlargement of the contact area between photosensitive-adhesive layer 61 and the thin-film filter 72, and the anchor effect of the photosensitive-adhesive layer 61 are obtained similar with thin-film filter 5, thereby the adhesion strength is enhanced.

Second Embodiment (Structure of the MEMS Package, the MEMS Microphone)

Figure 33:
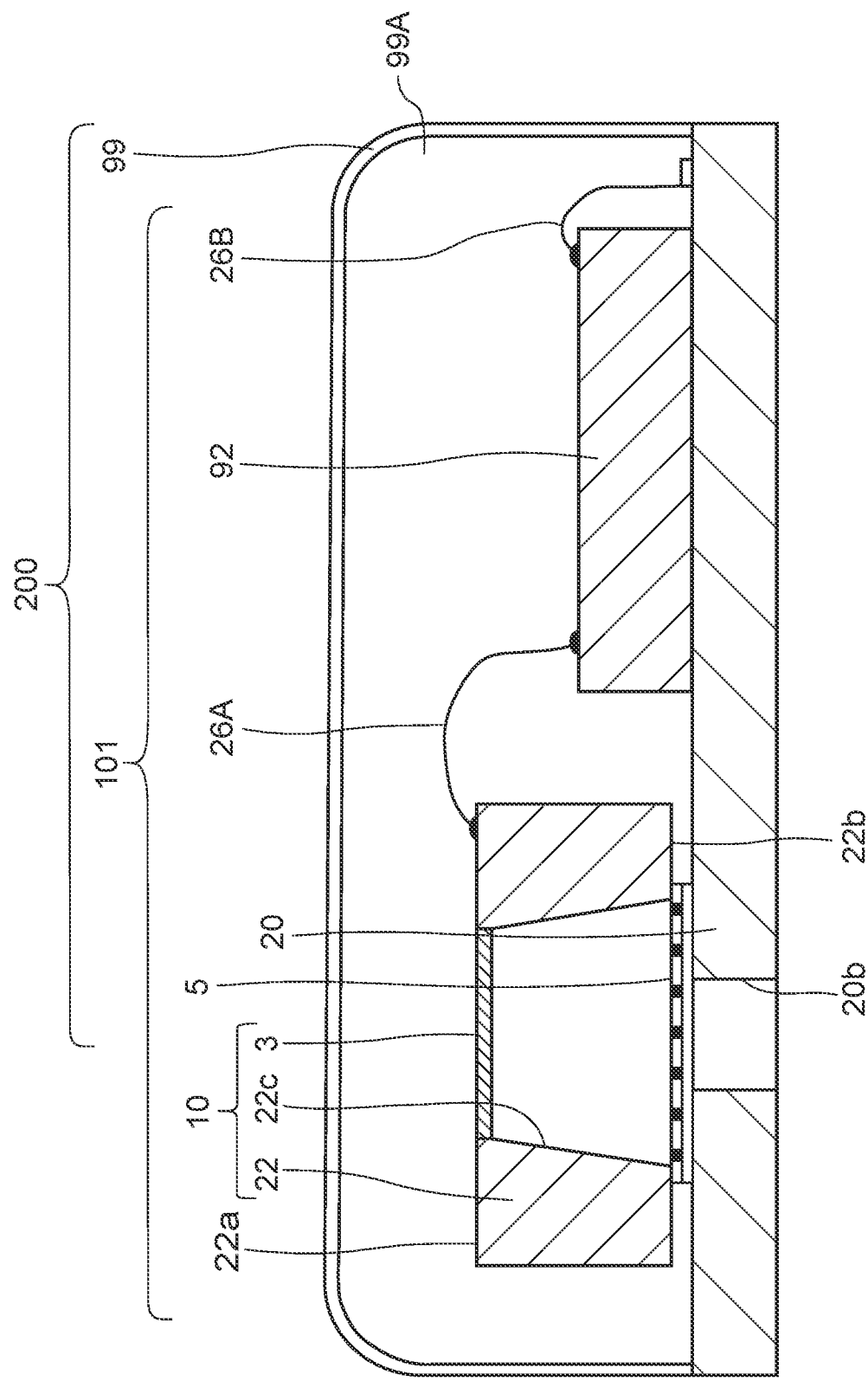
FIG. 33 is a sectional view, corresponding to FIG. 1, of the MEMS microphone according to the modified example.

Next, the MEMS package 101 and the MEMS microphone 200, according to the second embodiment of the present invention will be explained with reference to FIG. 33. FIG. 33 is a sectional view, corresponding to FIG. 1, showing the MEMS microphone 200.

As illustrated in FIG. 33, the MEMS microphone 200 has the MEMS package 101 and the cap 99.

In case of the above-described MEMS microphone 100 (the MEMS package 1), the MEMS chip 10 and the ASIC 92 are mounted on the package substrate 20 by the flip chip bonding.

To the contrary, in case of the MEMS microphone 200 (the MEMS package 101) according to the second embodiment, the MEMS chip 10 and the ASIC 92 are mounted on the package substrate 20 by the wire bonding.

Then, the MEMS package 101 is different in the following a), b), c), as compared with the MEMS package 1.

a) The thin-film filter 5 is adhered to the MEMS chip 10.

b) The MEMS package 101 does not have the bonding bumps 4, the sound shield 6, the electrode pads 7, 21.

c) The MEMS chip 10 is connected to the ASIC 92 by the wire 26A.

In case of the MEMS package 1, the thin-film filter 5 is adhered to the package substrate 20 though, in case of the MEMS package 101, the thin-film filter 5 is adhered to the MEMS chip 10. The thin-film filter 5 is adhered to the substrate surface 22b of the MEMS chip 10 so as to cover the hole part 22c.

In case of the MEMS package 101, in the thin-film part 16 of the thin-film filter 5, the adhered part to the substrate surface 22b is the adhesive region 16X, the part of the thin-film part 16, except for the adhesive region 16X, is the filter region 16Y (illustration of the adhesive region 16X and the filter region 16Y is omitted). The through holes 15 are formed in both the adhesive region 16X and the filter region 16Y. The through holes 15, formed in the adhesive region 16X, are the adhesive through holes 15X. The through holes 15, formed in the filter region 16Y are the filter through holes 15Y (illustration of the adhesive through holes 15X and the filter through holes 15Y is also omitted).

The ASIC 92 is connected to the package substrate 20 by the wire 26B not by the bonding bumps 93.

(Method of Manufacturing the MEMS Package, MEMS Microphone)

Figure 34:
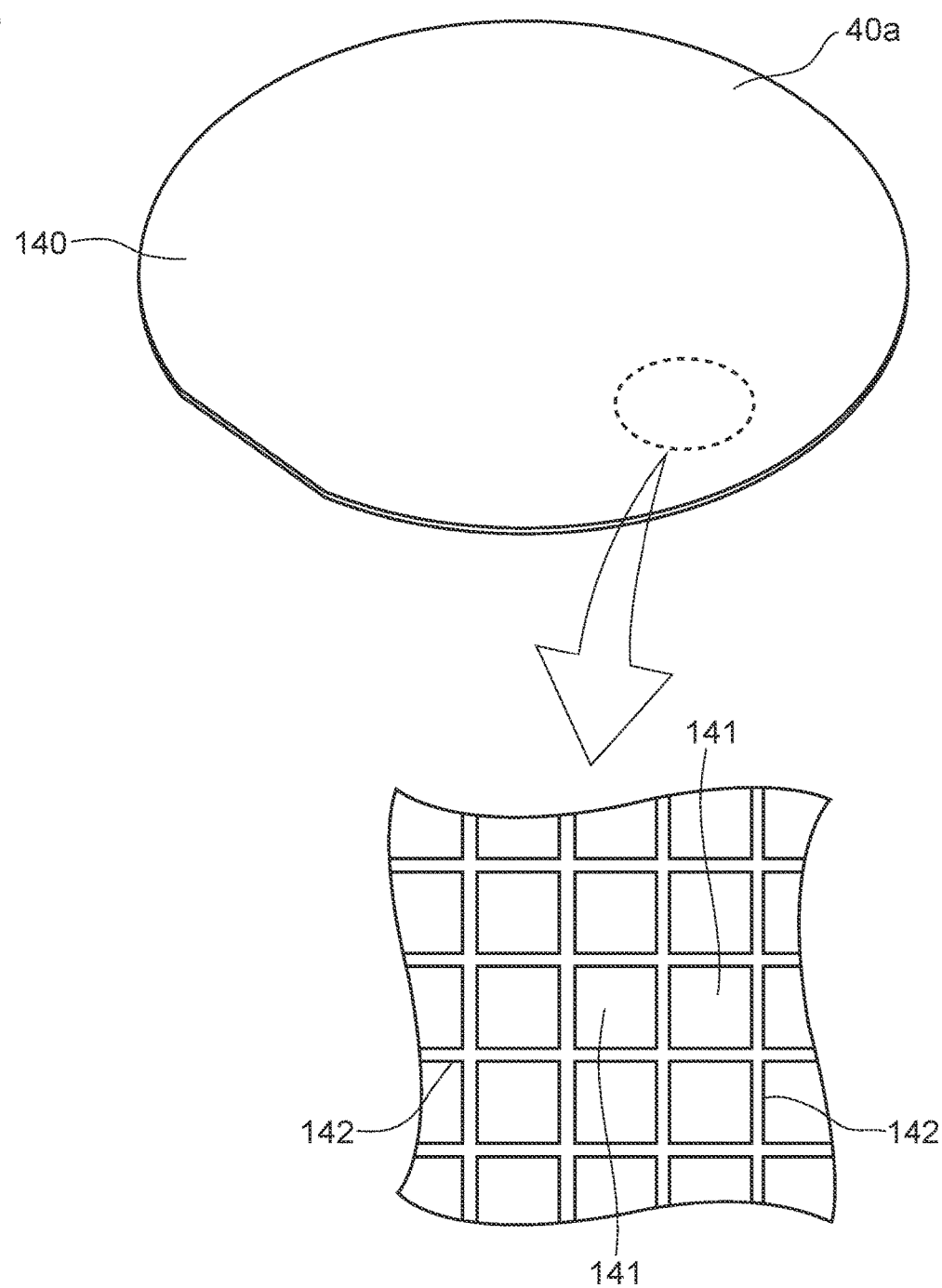
FIG. 34 is a perspective view showing a MEMS wafer.
Figure 35:
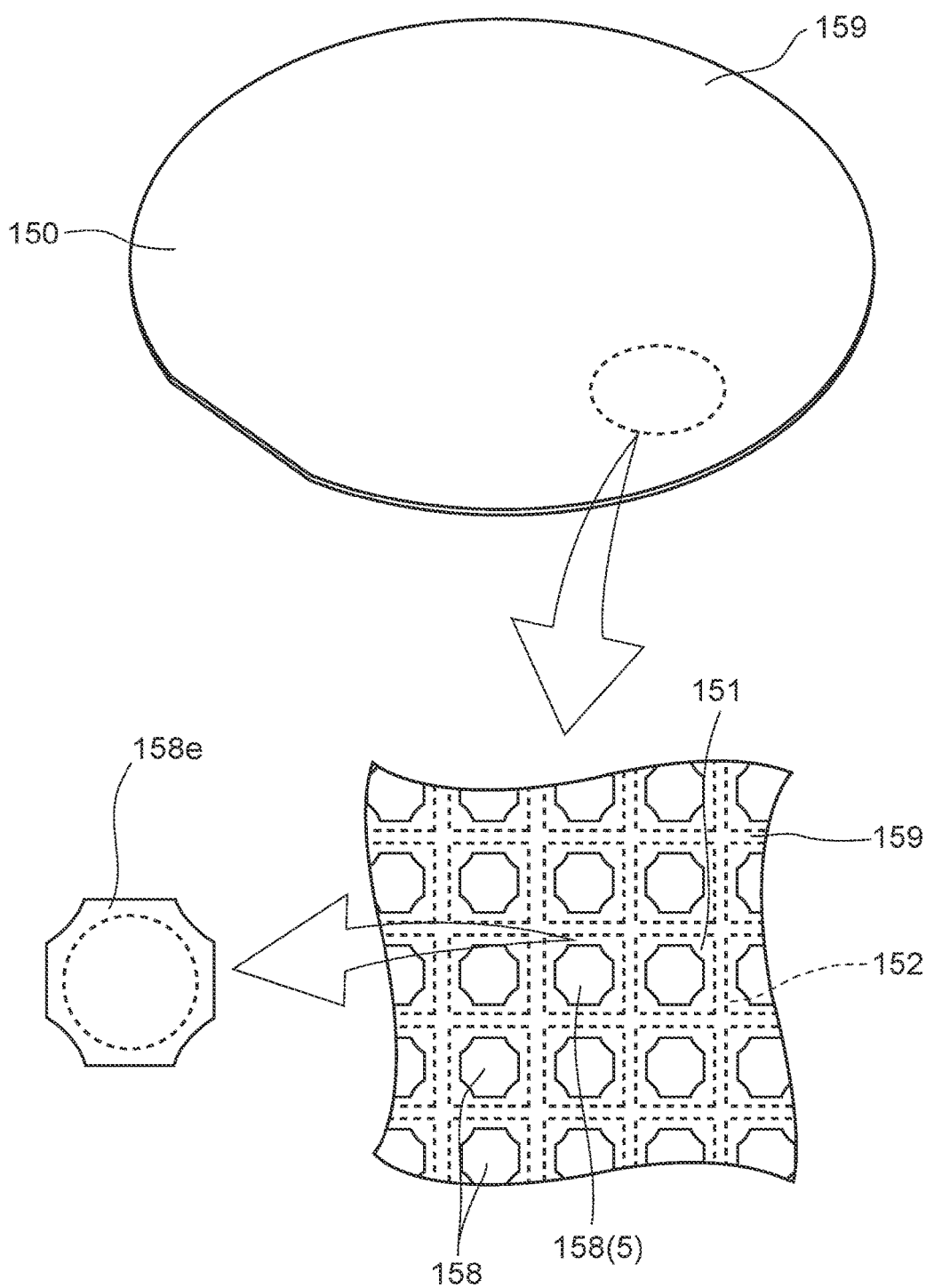
FIG. 35 is a perspective view showing the thin-film filter substrate.
Figure 36:
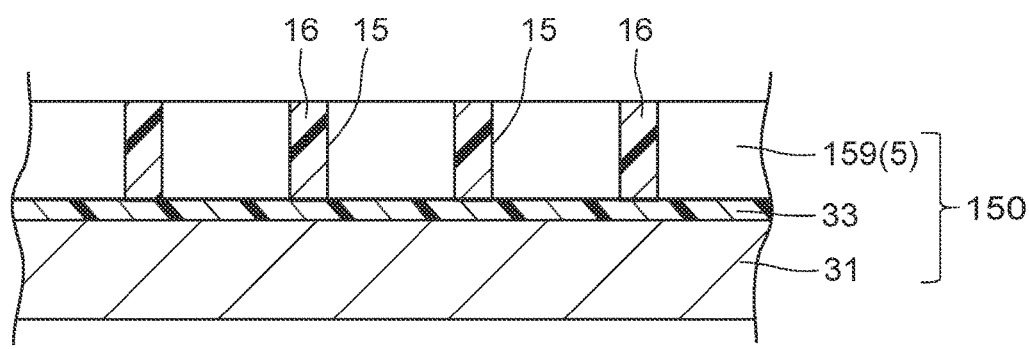
FIG. 36 is a sectional view showing a principal part of the thin-film filter substrate.
Figure 37:
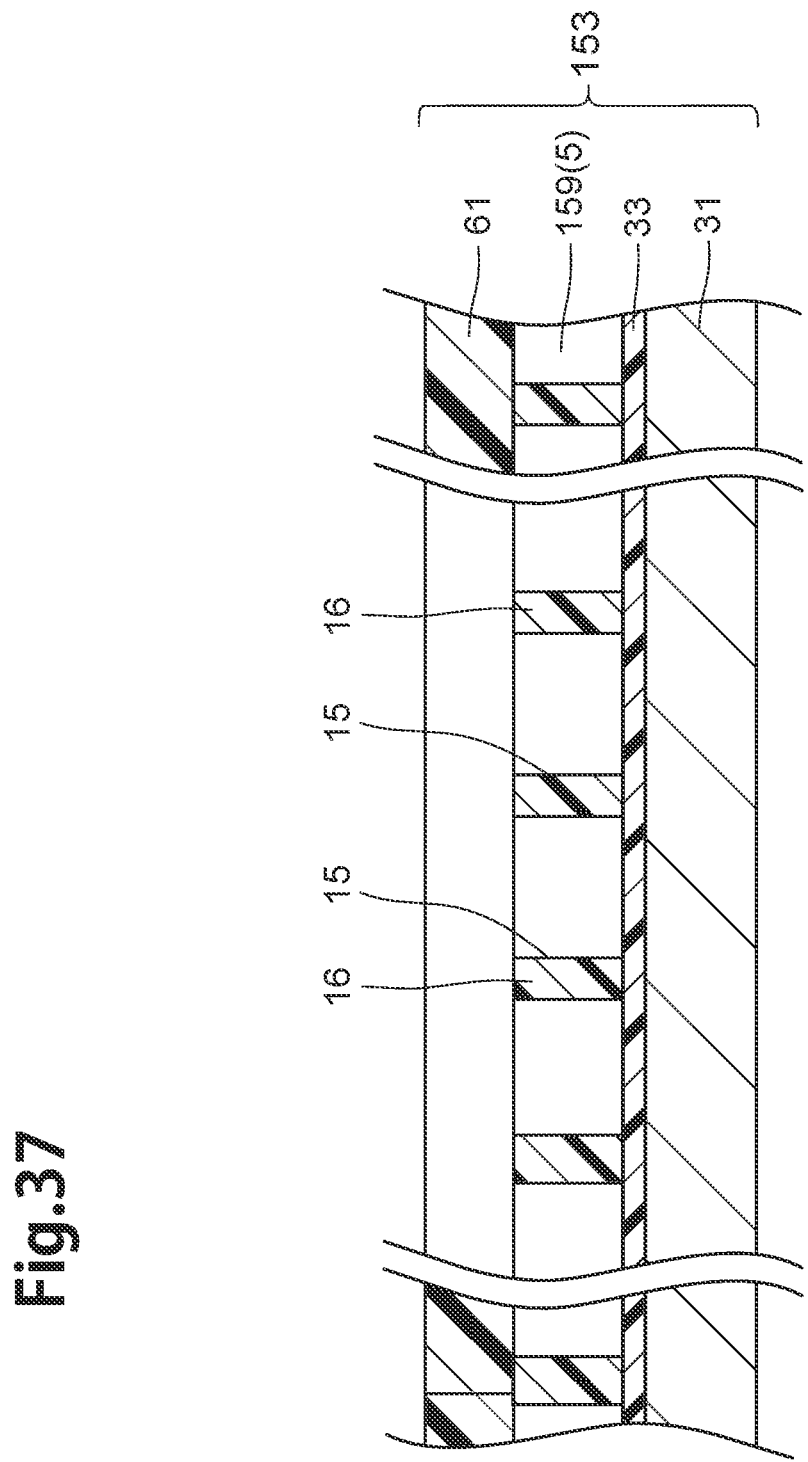
FIG. 37 is a sectional view showing a principal part of an adhesive-layer-formed filter substrate manufacturing step.
Figure 38:
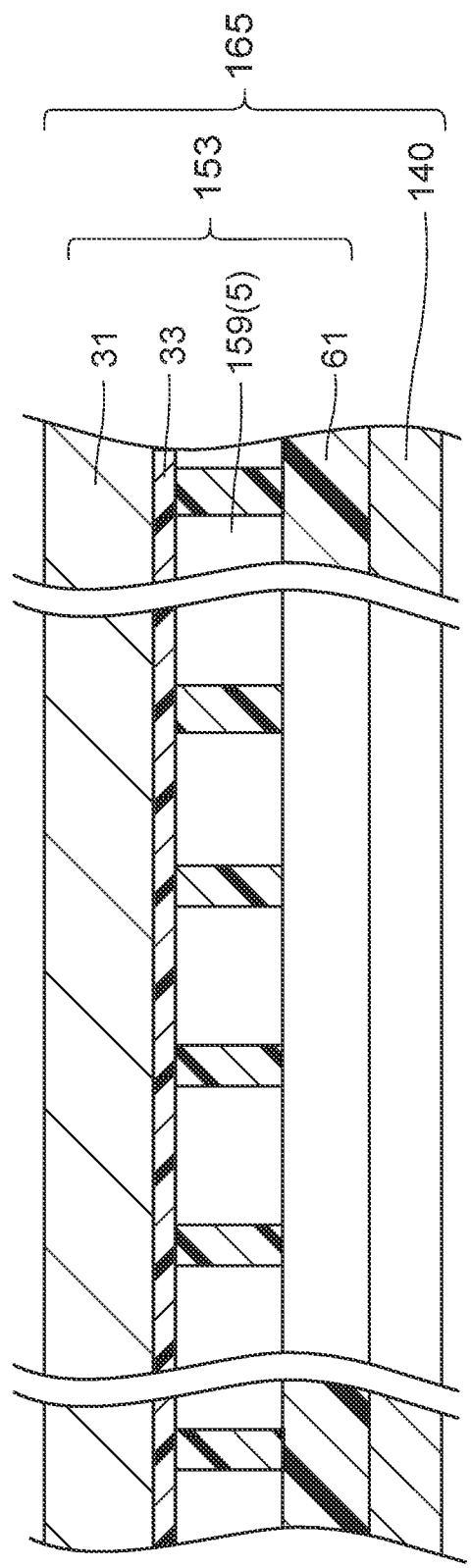
FIG. 38 is a sectional view showing a principal part of a substrate piling-up step.
Figure 39:
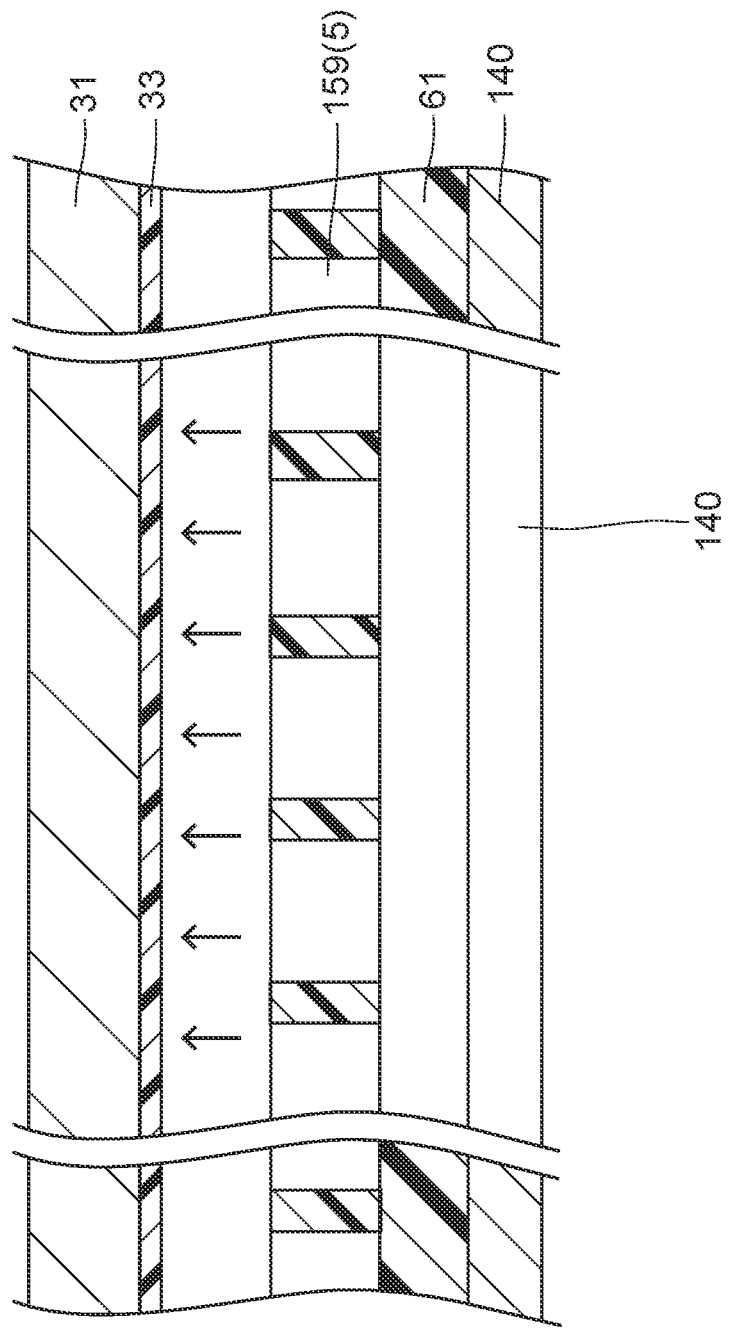
FIG. 39 is a sectional view showing the thin-film filter transcribing step.
Figure 40:
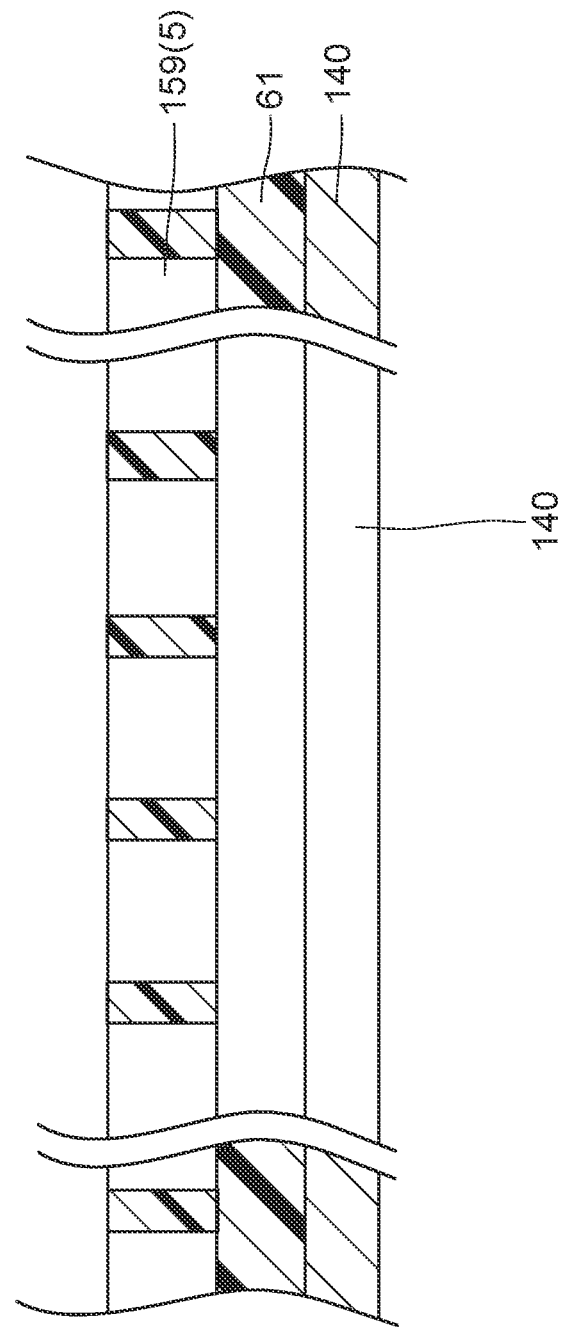
FIG. 40 is a sectional view of a principal part showing the manufacturing step subsequent that in FIG. 39.

Subsequently, the method of manufacturing the MEMS package 101, the MEMS microphone 200 having the above-described structure, will be explained with reference to FIG. 34 to FIG. 40. Here, FIG. 34 is a perspective view showing a later-described MEMS wafer 140, FIG. 35 is a perspective view showing a later-described thin-film filter substrate 150. FIG. 36 is a sectional view showing the principal part of the thin-film filter substrate 150. FIG. 37 is a sectional view showing a principal part of an adhesive-layer-formed filter substrate manufacturing step. FIG. 38 is a sectional view showing a principal part of a substrate piling-up step. FIGS. 39-40 are sectional views respectively showing principal parts of a thin-film filter transcribing step.

In the method of manufacturing the MEMS package 101, the MEMS microphone 200, the MEMS wafer 140 illustrated in FIG. 34, and the thin-film filter substrate 150 illustrated in FIG. 35, and the package substrate 20 are used. The adhesive-layer-formed filter substrate manufacturing step, the substrate piling-up step and the thin-film filter transcribing step are included in the method of manufacturing the MEMS package 101, the MEMS microphone 200.

The MEMS wafer 140 is formed with a silicon wafer. A plurality of MEMS regions 141 are formed on the MEMS wafer 140 by a regular arrangement. When the MEMS wafer 140 is divided along with scribe lines 142, the MEMS chips 10 are formed from each of the MEMS regions 141 (about 10,000-20,000 MEMS chips 10 are formed by every wafer).

The thin-film filter substrate 150 is in accord with the thin-film filter substrate 19 in the point that it has the silicon wafer 31 and the peeling-off adhesive layer 33 though, the thin-film filter substrate 150 is different with the thin-film filter substrate 19 in the point that it has a filter layer 159 instead of the filter layer 29. In case of the thin-film filter substrate 19, the separative regions 31X of the silicon wafer 31 are formed by a regular arrangement in accordance with the package-regions 41. To the contrary, in case of the thin-film filter substrate 150, the separative regions 31X of the silicon wafer 31 are formed by a regular arrangement in accordance with the MEMS regions 141 (illustration of the separative regions 31X is omitted in FIG. 35).

The thin-film filter substrate 150 is manufactured by performing the thin-film filter substrate manufacturing step, similar with the thin-film filter substrate 19. The peeling-off adhesive layer forming step and the thin-film filter forming step are included in the thin-film filter substrate manufacturing step.

In the peeling-off adhesive layer forming step, as illustrated in FIG. 36, the peeling-off adhesive layer 33 is formed on the silicon wafer 31, similar with the case which thin-film filter substrate 19 is manufactured. Next, the filter layer 159 is formed on the peeling-off adhesive layer 33 by performing the thin-film filter forming step. In this case, a resin layer forming step, a metal layer forming step, a resist pattern forming step, a metal pattern forming step and a through hole forming step are included in the thin-film filter forming step.

Then, the above-described filter layer 29 has a plurality of separative regions 51 in accordance with the package regions 41. To the contrary, as illustrated in FIG. 35, a plurality of separative regions 151, in accordance with the MEMS regions 141, are formed by a regular arrangement. The parts between the respective separative regions 151 are divided lines 152 in accordance with the scribe lines 142. A filter part 158 is arranged in the respective separative regions 151. There is no space where two or more filter parts 158 are arranged in the respective separative regions 151. The filter parts 158 are secured in the filter layer 159 without waste.

Then, the above-described thin-film filters 5 are formed from the respective filter-parts 158 afterward, similar with the case of the filter parts 58. A plurality of through holes 15 and the stripes-formed inner wall surfaces 38, similar with the thin-film filter 5, are formed in the respective filter parts 158. The filter parts 158 are formed in the modified rectangular shape in accordance with the thin-film filter 5.

Further, the resin layer forming step, the metal layer forming step, the resist pattern forming step, the metal pattern forming step and the through hole forming step are included in the thin-film filter forming step, similar with the case which thin-film filter substrate 19 is manufactured. The respective steps have differences in accordance with differences of the dividing pattern between the filter layer 29 and the filter layer 159 (separative regions 131X, 151), as compared with the case which the thin-film filter substrate 19 is manufactured though, the other steps are common.

When the filter layer 159 is formed, in the through hole forming step, the through holes 15 are formed in the adhesion planned regions, to the resin layer 44 which is used for forming the filter layer 159 (similar resin layer with the case which the filter layer 29 is formed, illustration of the resin layer is omitted in FIG. 36). The adhesion planned regions are planned regions, of the respective filter parts 158, which are adhered to the MEMS chips 10, they correspond to peripheral parts 158e of the respective filter parts 158 (see FIG. 35, about the peripheral part 158e). In this case, the through holes 15 are also formed in the inside regions of the peripheral parts 158e of the respective filter parts 158 (the regions correspond to the filter planned regions), in the respective separative regions 151 of the resin layer 44. The peripheral parts 158e are adhered to the substrate surface 22b (the peripheral of the hole part 22c) of the MEMS chip 10 afterward.

(Adhesive-Layer-Formed Filter Substrate Manufacturing Step)

In the adhesive-layer-formed filter substrate manufacturing step, the photosensitive-adhesive layer 61 is formed on the surface of the thin-film filter substrate 150, which is manufactured as the above. The photosensitive-adhesive layer 61 is formed by applying photosensitive polyimide adhesive sheet and so on. In this case, as illustrated in FIG. 37, the photosensitive-adhesive layer 61 is formed on the surface of the thin film substrate 150 in a following hole-formed structure. In case of the hole-formed structure, the photosensitive-adhesive layer 61 is formed in that a circular part, corresponding to the peripheral part 158e of the respective filter part 158, is left and the inside of the circular part is removed, in the respective separative regions 151. The photosensitive-adhesive layer 61 is patterned by the exposure, development. The adhesive-layer-formed filter substrate 153 is manufactured by performing the adhesive-layer-formed filter substrate manufacturing step. It is possible that the adhesive layer is formed with polyimide-based adhesive, epoxy resin-based adhesive instead of the photosensitive-adhesive layer 61. The photosensitive-adhesive layer 61, or the adhesive layers becomes the filter-adhesive layers. Further, for example, an adhesive, which is used for material of the filter-adhesive layer, is applied by ink-jet system, or it is applied by a dispenser, thereby the filter-adhesive layers are able to be formed.

(Substrate Piling-Up Step)

Further, in the substrate piling-up step, as illustrated in FIG. 38, the piled-up substrate 165 is manufactured. In this case, after an alignment, between the respective MEMS regions 141 and the respective separative regions 151, is performed, the adhesive-layer-formed filter substrate 153 and the MEMS wafer 140 are piling-up so that the photosensitive-adhesive layer 61 is overlaid on the respective MEMS regions 141, thereby the piled-up substrate 165 is manufactured.

(Filter-Layer Transcribing Step)

In the next filter-layer transcribing step, at first, the piled-up substrate 165 is heated. Then, the peeling-off adhesive layer 33 is foamed by that heat. Therefore, as illustrated in FIG. 39, the peeling-off adhesive layer 33 and the silicon wafer 31, being the base substrate, are peeled off from the piled-up substrate 165. Therefore, as illustrated in FIG. 40, the filter-layer 159 remains on the photosensitive-adhesive layer 61. Thereby, the filter-layer 159 is transcribed on the MEMS wafer 140. After that, when a MEMS chip mounting step and a panel cutting step is performed, the MEMS package 101 and the MEMS microphone 200 are manufactured.

(Entering Step)

An entering step is performed between the adhesive-layer-formed filter substrate manufacturing step and the substrate piling-up step. The entering step is performed so that parts of the photosensitive-adhesive layer 61 enter the through holes 15, formed in the peripheral parts 158e (adhesion planned region), when the photosensitive-adhesive layer 61 is formed in the peripheral parts 158e (adhesion planned region) of the respective filter parts 158, or after the photosensitive-adhesive layer 61 is formed. For example, in the adhesive-layer-formed filter substrate manufacturing step, the adhesive-layer-formed filter substrate 153 is heated when the photosensitive-adhesive layer 61 is formed in the peripheral parts 158e of the respective filter parts 158, thereby the parts of the photosensitive-adhesive layer 61 are able to enter the through holes 15 as the entering parts 61d. Further, in the substrate piling-up step, the adhesive-layer-formed filter substrate 153 and the MEMS wafer 140 are pushed each other when the adhesive-layer-formed filter substrate 153 and the MEMS wafer 140 are overlaid, thereby the parts of the photosensitive-adhesive layer 61 are able to enter the through holes 15, as the entering parts 61d (the entering parts 61d are not illustrated in FIGS. 37, 38). The entering step is performed as described-above, thereby the through holes 15, which the entering parts 61d are formed, become the above-described adhesive through holes 15X, and the adhesive layer entering structure is obtained.

The MEMS package 101, the MEMS microphone 200, which are manufactured as describe-above, are respectively different in that the thin-film filter 5 is adhered to the MEMS chip 10, as compared with the MEMS package 1, the MEMS microphone 100 though, the MEMS package 101, the MEMS microphone 200 are respectively common to the MEMS package 1, the MEMS microphone 100 in that the film filter 5 is adhered. Therefore, the MEMS package 101, the MEMS microphone 200 exhibit operation and effect the same with the MEMS package 1, the MEMS microphone 100.

(First Modified Example about MEMS Package, MEMS Microphone)

Figure 41:
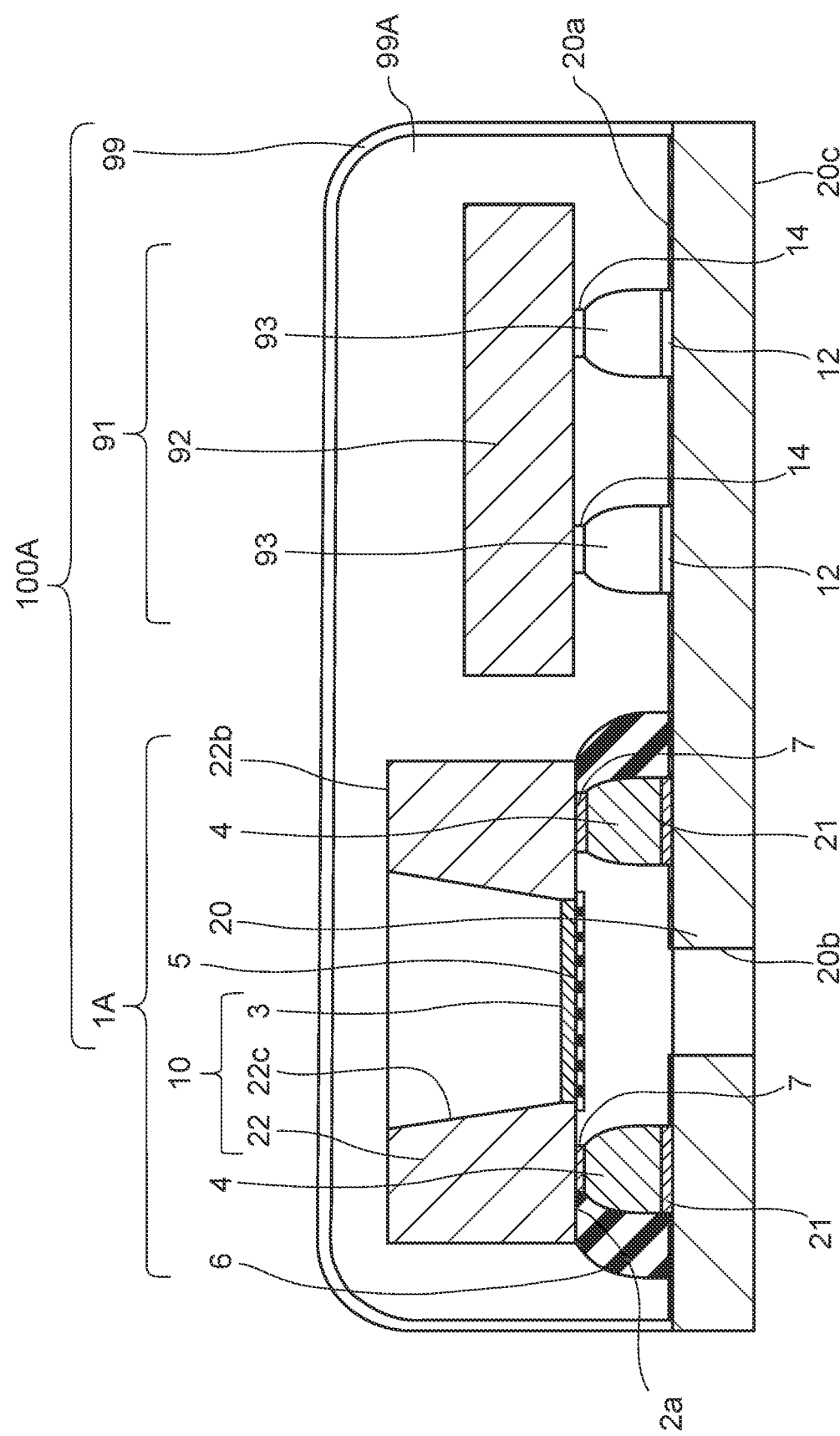
FIG. 41 is a sectional view, corresponding to FIG. 1, of the MEMS microphone, having the MEMS package according to the first modified example.
Figure 42:
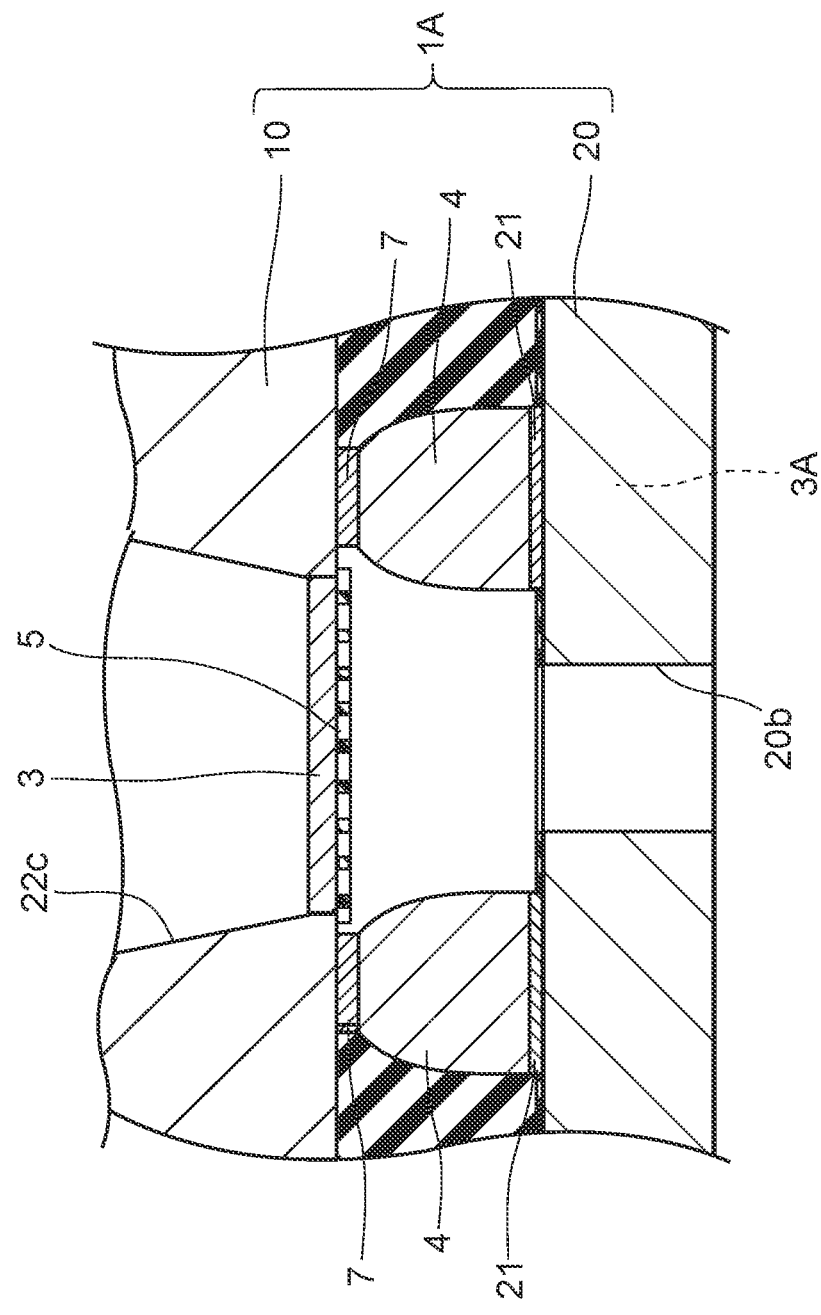
FIG. 42 is a sectional view, corresponding to FIG. 2, of the MEMS microphone, according to the first modified example.

FIG. 41 is a sectional view corresponding to FIG. 1, showing a MEMS microphone 100A having the MEMS package 1A according to the first modified example. FIG. 42 is a sectional view corresponding to FIG. 2, showing the MEMS microphone 100A.

The MEMS package 1A is different in that the thin-film filter 5 is formed on the MEMS chip 10, as compared with the MEMS package 1. Because the MEMS package 1A has the thin-film filter 5, similar with the MEMS package 1, it exhibits operation and effect the same with the MEMS package 1.

In case of the MEMS package 1A, the thin-film filter 5 is formed on the MEMS chip 10. Therefore, the MEMS chip 10 is manufactured by the manufacturing method similar with the MEMS package 101, according to the second embodiment, further, the MEMS chip 10 is mounted on the package substrate 20 by the FCB, thereby the MEMS package 1A is manufactured.

(Second Modified Example about MEMS Package, MEMS Microphone)

FIG. 43 is a sectional view corresponding to FIG. 33, showing the MEMS microphone 200A having the MEMS package 101A according to the second modified example. The MEMS package 101A is different in that the thin-film filter 5 is adhered to the package substrate 20, as compared with the MEMS package 101. Because the MEMS package 101A has the thin-film filter 5, similar with the MEMS package 101, it exhibits operation and effect the same with the MEMS package 101.

In case of the MEMS package 101A, the thin-film filter 5 is formed on the package substrate 20. Therefore, the MEMS package 101A is manufactured by using the package-panel 40 similar with the first embodiment. In this case, the filter-layer 29 is transcribed on the package-panel 40, similar with the first embodiment (for example, see FIG. 31). Then, the MEMS chip 10 and so on are mounted on the package-panel 40 by the wire-bonding, after that, the panel cutting step and so on are performed to manufacture the MEMS package 101A.

In the above-described embodiment, the MEMS package 1, having the membrane 3, is exemplarily explained though, the present invention is able to be applied to another MEMS packages. For example, the present invention is also applicable to the MEMS packages having the MEMS chip being used as a sensor, an actuator and so on.

Further, the type "double back-plate" having two not illustrated thin-films which are called back-plate are arranged in the upper side and the lower side of the membrane 3, is explained exemplarily in the embodiment. The present invention is also applicable to the type "single back-plate", having one back-plate is arranged in the one side of the membrane 3.

Further, as form of the through hole formed in the thin-film filter, a circular-shape in a plan view, a hexagon shape, a rectangular shape are able to be used. When the substrate, made of the transparent material such glass, quartz or the like, is used as the base substrate, the peeling-off adhesive layer is able to be used by attachment of UV tape to the base surface.

In the above-described embodiments, the MEMS microphone is explained as an example which the thin-film filter, according to the present invention, is applied though, the thin-film filter is applied to products except for the MEMS microphone, for example MEMS sensor.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A MEMS package comprising:
a MEMS chip;
a package substrate which the MEMS chip is adhered; and
a thin-film filter which is adhered to the package substrate or the MEMS chip,
wherein the thin-film filter comprises a thin-film part having a film surface and a rear film surface arranged a rear side of the film surface, and
a plurality of through holes being formed to penetrate the thin-film part from the film surface to the rear film surface,
wherein the through holes are formed in an adhesive region of the thin-film part,
wherein the adhesive region is adhered to the package substrate or the MEMS chip, wherein the MEMS package further comprises:
an adhesive-layer-entering structure which a filter-adhesive layer, being used for an adhesion of the thin-film filter, enters the through holes.

2. The MEMS package according to claim 1,
wherein the filter-adhesive layer is adhered to the adhesive region of the thin-film part and inner wall surfaces of the respective through holes.

3. A MEMS package comprising:
a MEMS chip;
a package substrate which the MEMS chip is adhered; and
a thin-film filter which is adhered to the package substrate or the MEMS chip,
wherein the thin-film filter comprises a thin-film part having a film surface and a rear film surface arranged a rear side of the film surface, and
a plurality of through holes being formed to penetrate the thin-film part from the film surface to the rear film surface,
wherein the through holes are formed in an adhesive region of the thin-film part,
wherein the adhesive region is adhered to the package substrate or the MEMS chip,
wherein the MEMS package further comprises:
stripes-formed inner wall surfaces having stripe-like parts formed along with an intersecting direction intersecting the film surface, the stripes-formed inner wall surfaces are formed inside the respective through holes.

4. A MEMS package comprising:
a MEMS chip;
a package substrate which the MEMS chip is adhered; and
a thin-film filter which is adhered to the package substrate or the MEMS chip,
wherein the thin-film filter comprises a thin-film part having a film surface and a rear film surface arranged a rear side of the film surface, and
a plurality of through holes being formed to penetrate the thin-film part from the film surface to the rear film surface,
wherein the through holes are formed in an adhesive region of the thin-film part,
wherein the adhesive region is adhered to the package substrate or the MEMS chip,
wherein the through holes are further formed in a filter region except for the adhesive region of the thin-film part,
wherein the MEMS package further comprises stripes-formed inner wall surfaces having stripe-like parts formed along with an intersecting direction intersecting the film surface, the stripes-formed inner wall surfaces are formed respectively inside both the through holes formed in the adhesive region and the through holes formed in the filter region.

5. The MEMS package according to claim 1,
wherein the through holes are further formed in a filter region except for the adhesive region of the thin-film part,
wherein the MEMS package further comprises stripes-formed inner wall surfaces having stripe-like parts formed along with an intersecting direction intersecting the film surface, the stripes-formed inner wall surfaces are formed respectively inside both the through holes formed in the adhesive region and the through holes formed in the filter region.

6. The MEMS package according to claim 3,
wherein the stripe-like parts are formed as concave parts which are indented from inner wall surfaces of the through holes or convex parts which protrude from the inner wall surfaces of the through holes,
wherein the filter-adhesive layer enters the concave parts when the stripe-like parts are formed as the concave parts, or the filter-adhesive layer is in contact with protruding surfaces, of the convex parts, protrude from the inner wall surfaces when the stripe-like parts are formed as the convex parts.

7. The MEMS package according to claim 4,
wherein the stripe-like parts are formed as concave parts which are indented from inner wall surfaces of the through holes or convex parts which protrude from the inner wall surfaces of the through holes,
wherein the filter-adhesive layer enters the concave parts when the stripe-like parts are formed as the concave parts, or the filter-adhesive layer is in contact with protruding surfaces, of the convex parts, protrude from the inner wall surfaces when the stripe-like parts are formed as the convex parts.

8. The MEMS package according to claim 4,
wherein the through holes are formed in circular shapes in a plan view,
wherein the thin-film filter comprises a first through hole-group and a second through hole-group respectively having the through holes,
wherein the first through hole-group has a first through hole, arranged in a position which the interval to a peripheral end part of the thin-film part is set a first interval, and the through holes are arranged at a constant interval in a straight line,
wherein the second through hole-group has a second through hole, arranged in a position which the interval to the peripheral end part is set a second interval different from the first interval, and the through holes are arranged at a constant interval in a straight line,
wherein in the thin-film filter, a first line formed by the first through hole-group, and a second line formed by the second through hole-group, are arranged alternately.

9. The MEMS package according to claim 3,
wherein the stripe-like parts are arranged in almost the whole of the inner wall surface of the respective through holes.

10. The MEMS package according to claim 3,
wherein the stripe-like parts are formed in the length longer than 80% of a film thickness being a thickness of the thin-film part.

11. A MEMS microphone comprising:
a MEMS package; and
a cap which wraps the MEMS package,
wherein the MEMS package comprises a MEMS chip, a package substrate which the MEMS chip is adhered, and a thin-film filter which is adhered to the package substrate or the MEMS chip,
wherein the thin-film filter comprises a thin-film part having a film surface and a rear film surface arranged a rear side of the film surface, and
a plurality of through holes being formed to penetrate the thin-film part from the film surface to the rear film surface,
wherein the through holes are formed in an adhesive region of the thin-film part,
wherein the adhesive region is adhered to the package substrate or the MEMS chip, the MEMS microphone further comprises:
an adhesive-layer-entering structure which a filter-adhesive layer, being used for an adhesion of the thin-film filter, enters the through holes.

* * * * *